United States Patent
Nagase et al.

(10) Patent No.: US 8,098,514 B2
(45) Date of Patent: Jan. 17, 2012

(54) MAGNETORESISTIVE ELEMENT AND MAGNETIC MEMORY

(75) Inventors: Toshihiko Nagase, Sagamihara (JP); Katsuya Nishiyama, Yokohama (JP); Tadashi Kai, Tokyo (JP); Masahiko Nakayama, Yokohama (JP); Makoto Nagamine, Komae (JP); Minoru Amano, Sagamihara (JP); Masatoshi Yoshikawa, Yokohama (JP); Tatsuya Kishi, Yokohama (JP); Hiroaki Yoda, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 755 days.

(21) Appl. No.: 12/233,121

(22) Filed: Sep. 18, 2008

(65) Prior Publication Data

US 2009/0080239 A1    Mar. 26, 2009

(30) Foreign Application Priority Data

Sep. 26, 2007    (JP) ................................. 2007-250287

(51) Int. Cl.
*G11C 11/00*    (2006.01)
(52) U.S. Cl. ......... 365/158; 365/148; 365/171; 977/935
(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 483/3; 428/810–816, 817–825.1, 428/826; 977/933–935
See application file for complete search history.

(56) References Cited

U.S. PATENT DOCUMENTS

| | | | |
|---|---|---|---|
| 6,777,730 B2* | 8/2004 | Daughton et al. | 257/295 |
| 7,897,274 B2* | 3/2011 | Yuasa et al. | 428/811.3 |
| 2002/0192506 A1* | 12/2002 | Coffey et al. | 428/694 TM |
| 2003/0048676 A1* | 3/2003 | Daughton et al. | 365/200 |
| 2004/0185306 A1* | 9/2004 | Coffey et al. | 428/694 TM |
| 2005/0104101 A1 | 5/2005 | Sun et al. | |
| 2005/0185455 A1 | 8/2005 | Huai | |
| 2007/0086121 A1 | 4/2007 | Nagase et al. | |
| 2007/0297103 A1* | 12/2007 | Zhang et al. | 360/324.12 |

FOREIGN PATENT DOCUMENTS

| | | |
|---|---|---|
| JP | 4-111302 | 4/1992 |
| JP | 5-6820 | 1/1993 |
| JP | 2007-142364 | 6/2007 |

OTHER PUBLICATIONS

U.S. Appl. No. 13/043,064, filed Mar. 8, 2011, Daibou, et al.
U.S. Appl. No. 12/409,654, filed Mar. 24, 2009, Yoshikawa, et al.
U.S. Appl. No. 12/879,544, filed Sep. 10, 2010, Kai, et al.

* cited by examiner

*Primary Examiner* — Richard Elms
*Assistant Examiner* — Harry W Byrne
(74) *Attorney, Agent, or Firm* — Oblon, Spivak, McClelland, Maier & Neustadt, L.L.P.

(57) ABSTRACT

A magnetoresistive element includes a first reference layer having magnetic anisotropy perpendicular to a film surface, and an invariable magnetization, a recording layer having a stacked structure formed by alternately stacking magnetic layers and nonmagnetic layers, magnetic anisotropy perpendicular to a film surface, and a variable magnetization, and an intermediate layer provided between the first reference layer and the recording layer, and containing a nonmagnetic material. The magnetic layers include a first magnetic layer being in contact with the intermediate layer and a second magnetic layer being not in contact with the intermediate layer. The first magnetic layer contains an alloy containing cobalt (Co) and iron (Fe), and has a film thickness larger than that of the second magnetic layer.

24 Claims, 18 Drawing Sheets

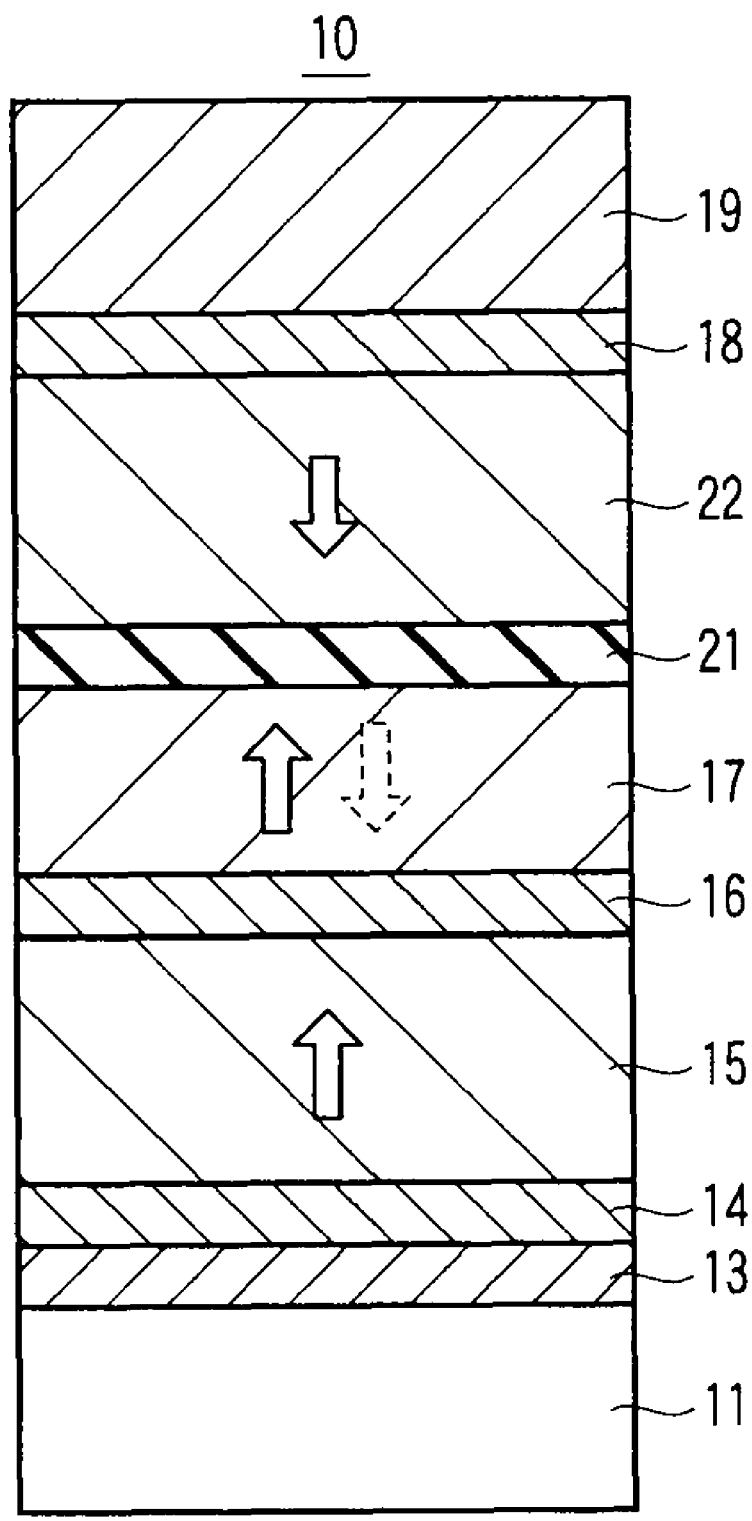
F I G. 12

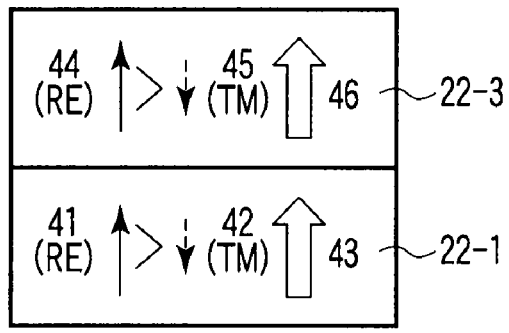
F I G. 15
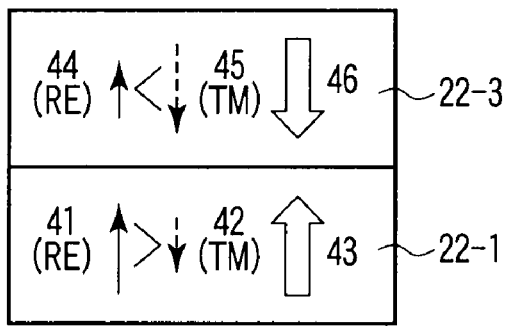
F I G. 16
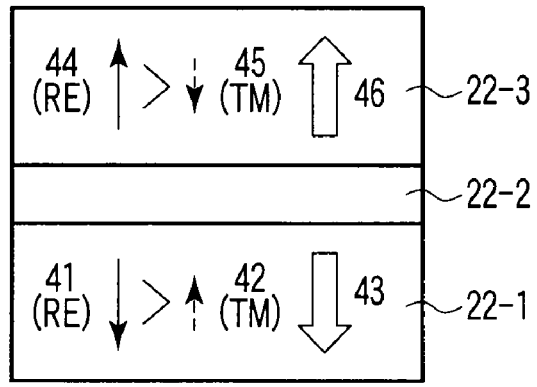
F I G. 17

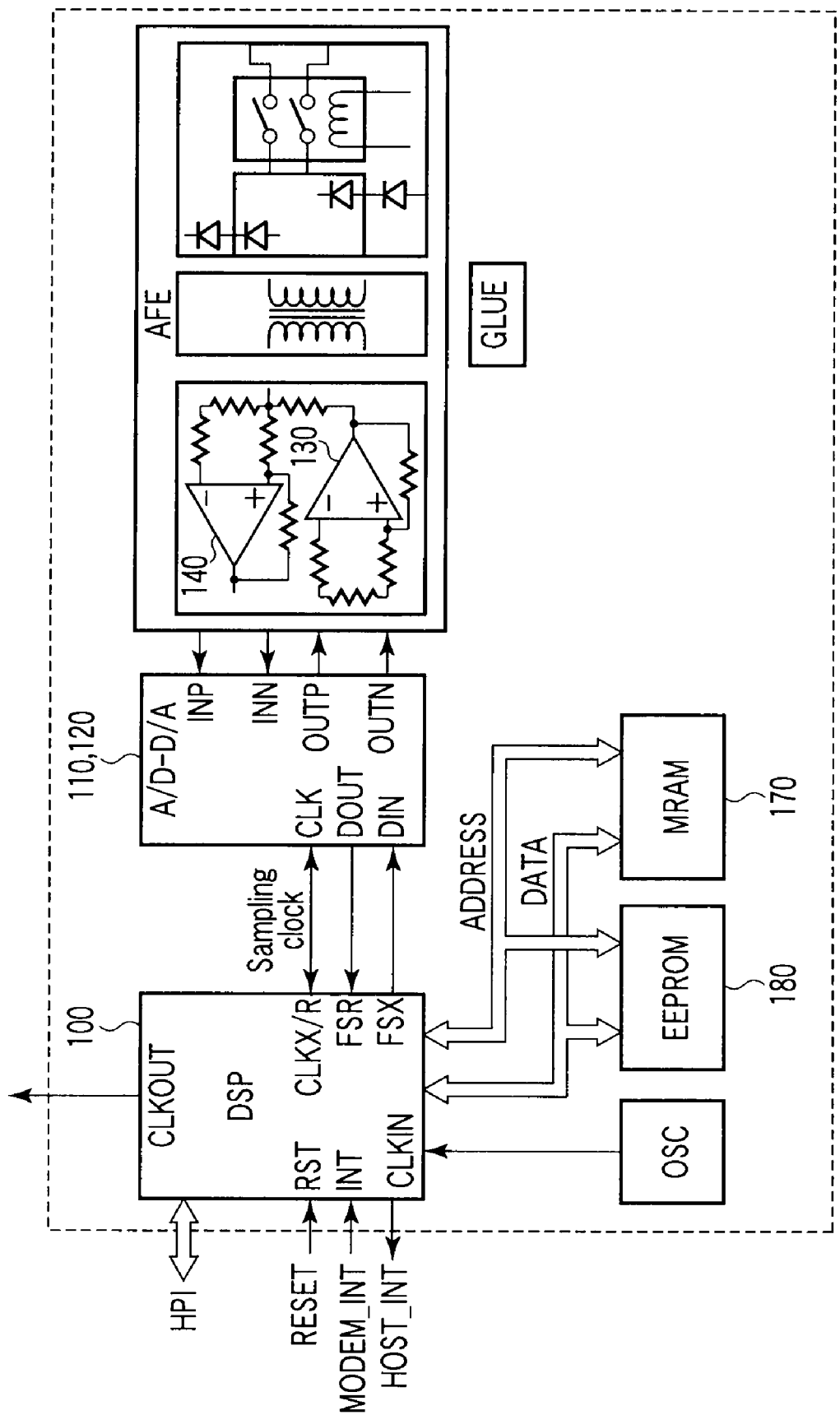
F I G. 21

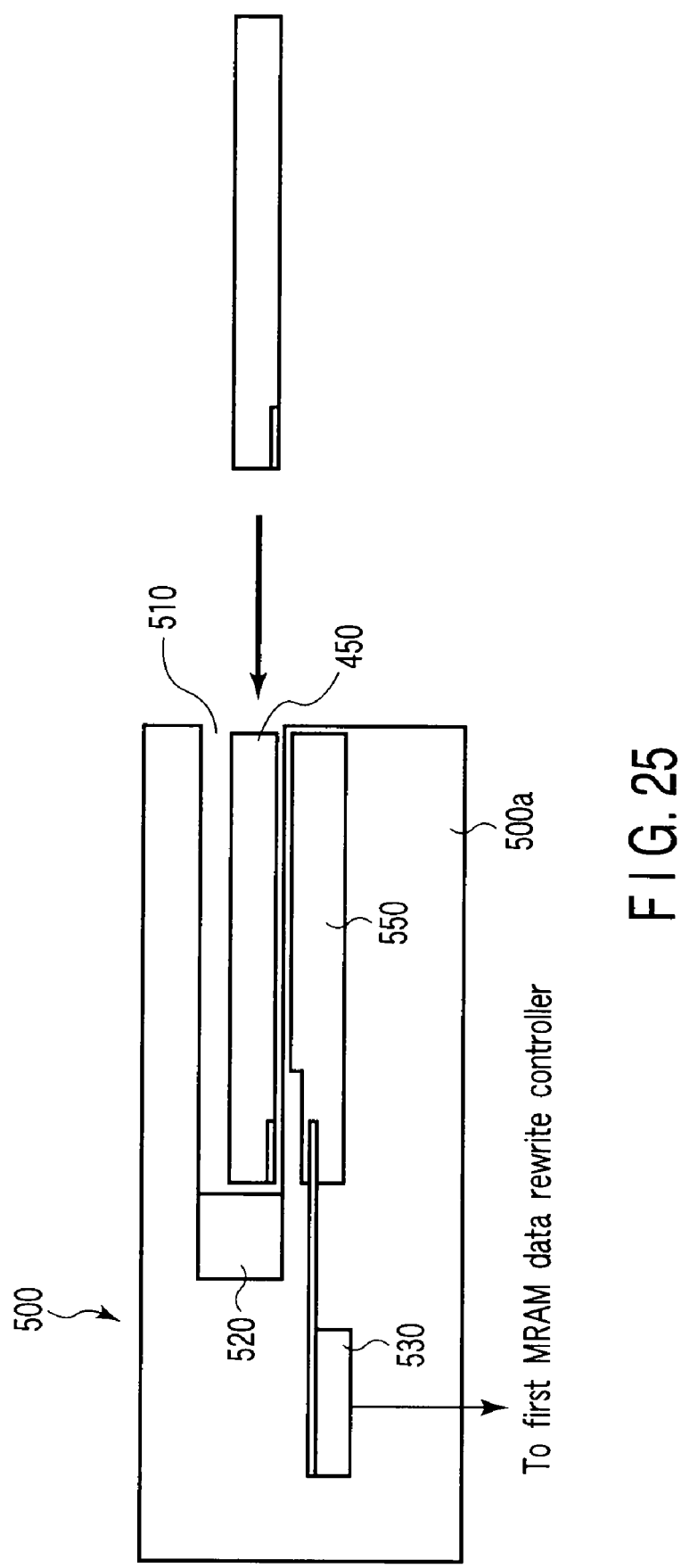
F I G. 25

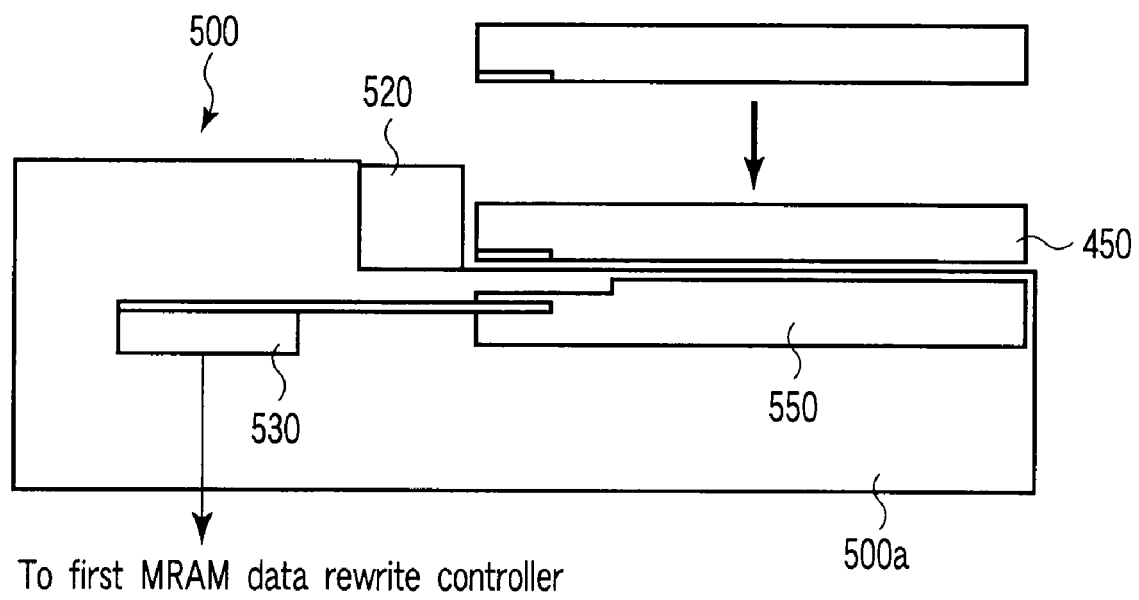
F I G. 26

MAGNETORESISTIVE ELEMENT AND MAGNETIC MEMORY

CROSS-REFERENCE TO RELATED APPLICATIONS

This application is based upon and claims the benefit of priority from prior Japanese Patent Application No. 2007-250287, filed Sep. 26, 2007, the entire contents of which are incorporated herein by reference.

BACKGROUND OF THE INVENTION

1. Field of the Invention

The present invention relates to a magnetoresistive element and magnetic memory, e.g., a magnetoresistive element capable of recording information by supplying a current in two directions, and a magnetic memory using the same.

2. Description of the Related Art

The magnetoresistive effect is applied to a hard disk drive (HDD) as a magnetic memory device and presently put into practical use. The giant magnetoresistive (GMR) effect or tunneling magnetoresistive (TMR) effect is applied to a magnetic head of the HDD. Both the GMR effect and TMR effect detect a magnetic field from a magnetic medium by using a resistance change caused by an angle the magnetization directions in two magnetic layers make with each other.

Recently, various techniques have been proposed to implement a magnetic random access memory (MRAM) by using a GMR or TMR element. An example is a method of recording binary 1 or 0 in accordance with the magnetization configuration of a magnetic tunnel junction (MTJ) element, and reading the information by using the resistance change caused by the TMR effect. Various techniques have been proposed to put an MRAM using this method into practical use as well. Additionally, magnetization reversal caused by a spin-polarized current has been theoretically predicted and experimentally confirmed, and an MRAM using a spin-polarized current has been proposed. This method can switch magnetization in a magnetic layer by only supplying a spin-polarized current to the magnetic layer. If the volume of the magnetic layer is small, only smaller spin-polarized electrons need be injected. Therefore, the method is expected to advance micropatterning and reduce a current at the same time. However, the problem of thermal disturbance arises as micropatterning advances.

The magnetic anisotropic energy density must be increased in order to secure a high thermal disturbance resistance. An in-plane magnetization arrangement that has been principally studied so far generally uses the magnetic shape anisotropy. In this case, the magnetic anisotropy is secured by using the shape. This makes a switching current sensitive to the shape, and increases the variation in switching current as micropatterning advances, thus posing a problem. To increase the magnetic anisotropic energy density by using the magnetic shape anisotropy, it is possible to increase the aspect ratio of an MTJ element, increase the film thickness of a magnetic layer, or increase the saturation magnetization in the magnetic layer.

Increasing the aspect ratio of an MTJ element is unsuitable to increase the capacity because the cell area increases. Increasing the film thickness or saturation magnetization of a magnetic material is unpreferable because the value of a spin-polarized current required for magnetization reversal increases. When using not the magnetic shape anisotropy but the magnetocrystalline anisotropy in the in-plane magnetization arrangement, if a material (e.g., a Co—Cr alloy material used in a hard disk medium) having a high magnetocrystalline anisotropic energy density is used, the crystallographic axis largely disperse in the plane. This decreases the magnetoresistance (MR), or induces an incoherent precession. As a consequence, the switching current increases.

By contrast, when using the magnetocrystalline anisotropy in a perpendicular magnetization arrangement, it is possible to suppress the dispersion of the crystallographic axis that is the problem in the in-plane magnetization arrangement. For example, the crystal structure of the Co—Cr alloy material described above is the hexagonal structure, and has uniaxial magnetocrystalline anisotropy whose axis of easy magnetization is the c-axis. Therefore, the crystal orientation need only be controlled such that the c-axis is parallel to a direction perpendicular to the film surface. In the in-plane magnetization arrangement, the c-axis must be uniaxially arranged in the film surface, and the rotation of each crystal grain in the film surface rotates the crystallographic axis and disperses the uniaxial direction. In the perpendicular magnetization arrangement, the c-axis is perpendicular to the film surface. Accordingly, even when each crystal grain rotates in the film surface, the c-axis keeps being perpendicular and does not disperse.

Similarly, a perpendicular magnetization MTJ arrangement can be implemented by controlling the c-axis in the perpendicular direction in the tetragonal structure as well. Examples of a magnetic material having the tetragonal structure are an Fe—Pt ordered alloy, Fe—Pd ordered alloy, Co—Pt ordered alloy, Fe—Co—Pt ordered alloy, Fe—Ni—Pt ordered alloy, and Fe—Ni—Pd ordered alloy each having the $L1_0$ crystal structure. To use the $L1_0$ structure as a perpendicular magnetization film, however, the crystal orientation must be controlled such that the (001) plane orients. To do this, it is necessary to develop an underlying layer for controlling the crystal orientation and an annealing process for ordering in accordance with the magnetization switching method using a spin-polarized current.

It is also possible to implement the perpendicular magnetic anisotropy using the magnetic anisotropy of an interface. An example of a perpendicular magnetic film using the magnetic anisotropy of an interface is a so-called multilayer formed by repeatedly stacking magnetic layers and nonmagnetic layers. This can also suppress the dispersion of the crystallographic axis that is the problem in the in-plane magnetization arrangement. In a magnetic material having a multilayer, the perpendicular magnetic anisotropy is not ensured mainly by the magnetocrystalline anisotropy, unlike an Fe—Pt ordered alloy, and is therefore relatively hardly restricted by the crystal orientation. As a multilayer material having the perpendicular magnetic anisotropy, a system formed by alternately stacking a Co magnetic layer and a Pt nonmagnetic layer is well known.

When the magnetization reversing method using a spin-polarized current is taken into consideration, a material having a small damping constant is preferably used for a recording layer. However, if Pt of the nonmagnetic layer exists on the interface of the magnetic layer, the spin pumping effect makes the damping constant large. The magnetic layer is preferably thinned to about 0.3 to 1.0 nm from the viewpoint of the magnetic anisotropic energy density of the multilayer. However, since the thin magnetic layer enhances the spin pumping effect, the damping constant becomes large.

A high magnetoresistive ratio is necessary to increase the capacity of an MRAM from the viewpoint of read. Recently, many MTJ elements using MgO as a barrier material having a high magnetoresistive ratio have been reported, and it is regarded as important that the (100) plane of MgO orients in order to achieve a high magnetoresistive ratio. When CoFeB magnetic layers having a microcrystalline or amorphous structure are formed on both interface sides of MgO, the (100) plane orients, as is known. No multilayer using CoFeB as a magnetic layer has been reported. CoFeB having no clear crystal structure is expected to considerably decrease the perpendicular magnetic anisotropy as compared to Co having a crystal structure.

When the magnetization of the recording layer having the perpendicular magnetic anisotropy is switched using the spin transfer torque writing method, the aspect ratio of the spin transfer torque writing element can be 1. Hence, this element is also suitable for micropatterning. If magnetization reversal by a spin-polarized current is achieved in a perpendicular magnetization spin transfer torque writing element, it is possible to reduce a write current, secure a high thermal disturbance resistance of bit information, and reduce the cell area at the same time. However, the high TMR and the increase in the damping constant caused by the spin pumping effect pose problems, as described above, in forming a spin transfer torque writing element using a multilayer for a recording layer. Neither a report nor a practical method of a spin transfer torque writing element which achieves a low damping constant and a high MR ratio using a multilayer as a recording layer material has been proposed.

BRIEF SUMMARY OF THE INVENTION

According to an aspect of the present invention, there is provided a magnetoresistive element comprising: a first reference layer having magnetic anisotropy perpendicular to a film surface, and an invariable magnetization; a recording layer having a stacked structure formed by alternately stacking magnetic layers and nonmagnetic layers, magnetic anisotropy perpendicular to a film surface, and a variable magnetization; and a first intermediate layer provided between the first reference layer and the recording layer, and containing a nonmagnetic material. The magnetic layers include a first magnetic layer being in contact with the first intermediate layer and a second magnetic layer being not in contact with the first intermediate layer. The first magnetic layer contains an alloy containing cobalt (Co) and iron (Fe), and has a film thickness larger than that of the second magnetic layer.

According to an aspect of the present invention, there is provided a magnetoresistive element comprising: a reference layer having magnetic anisotropy perpendicular to a film surface, and an invariable magnetization; a recording layer having a stacked structure formed by alternately stacking magnetic layers and nonmagnetic layers, magnetic anisotropy perpendicular to a film surface, and a variable magnetization; and a intermediate layer provided between the reference layer and the recording layer, and containing a nonmagnetic material. The magnetic layers include a first magnetic layer being in contact with the intermediate layer and a second magnetic layer being not in contact with the intermediate layer. The first magnetic layer contains an alloy which has a composition $Co_2XY$, and has a film thickness larger than that of the second magnetic layer. X is at least one element selected from the group consisting of vanadium (V), chromium (Cr), manganese (Mn), iron (Fe), nickel (Ni), and copper (Cu). Y is at least one element selected from the group consisting of aluminum (Al), gallium (Ga), indium (In), silicon (Si), germanium (Ge), tin (Sn), and antimony (Sb).

According to an aspect of the present invention, there is provided a magnetic memory comprising a memory cell including the magnetoresistive element, and a first electrode and a second electrode sandwiching the magnetoresistive element and configured to supply a current to the magnetoresistive element.

BRIEF DESCRIPTION OF THE SEVERAL VIEWS OF THE DRAWING

FIG. 12 is a sectional view illustrating the arrangement of an MTJ element 10 of Practical Example 2-3;

FIG. 15 is a view for explaining another example of the arrangement of a reference layer 22;

FIG. 16 is a view for explaining still another example of the arrangement of the reference layer 22;

FIG. 17 is a view for explaining still another example of the arrangement of the reference layer 22;

FIG. 21 is a block diagram illustrating a digital subscriber line (DSL) data path unit of a DSL modem according to Application Example 1 of the MRAM;

FIG. 25 is a sectional view illustrating a transfer apparatus 500 for transferring data to the MRAM card;

FIG. 26 is a sectional view illustrating a fitting type transfer apparatus 500 for transferring data to the MRAM card.

DETAILED DESCRIPTION OF THE INVENTION

Figure 1:
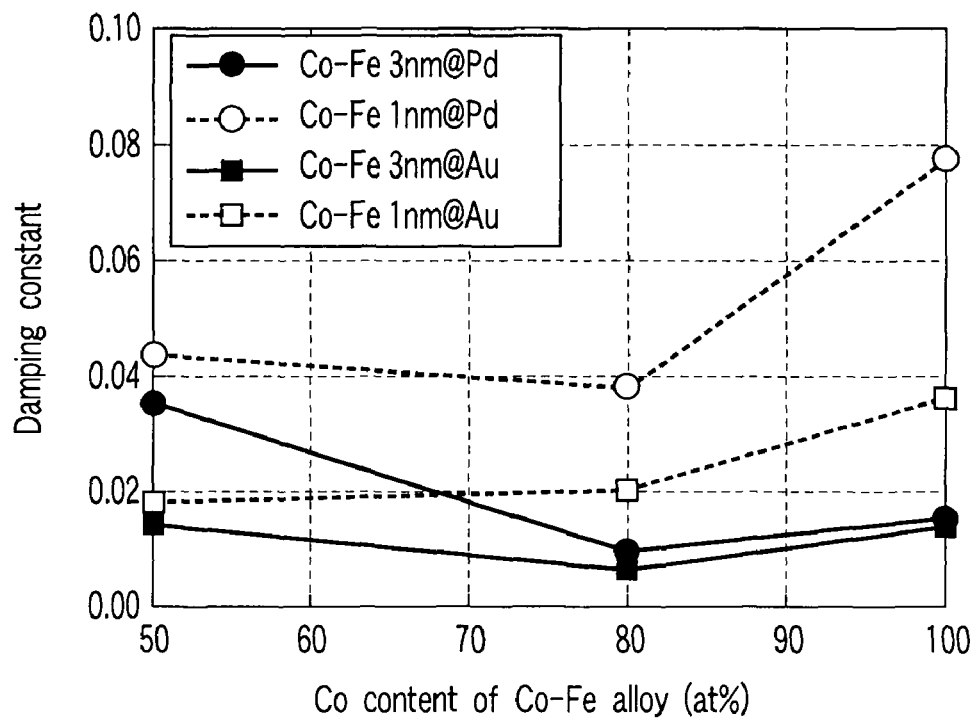
FIG. 1 is a graph illustrating the relationship between the damping constant and the composition of an Co—Fe alloy.

Embodiments of the present invention will be explained below with reference to the accompanying drawing. Note that in the following explanation, the same reference numbers denote elements having the same functions and arrangements, and a repetitive explanation will be made only when necessary.

First Embodiment

[1] Multilayer as Recording Layer Material

A multilayer is a stacked structure which is formed by alternately stacking magnetic layers and nonmagnetic layer. To use the multilayer for a recording layer included in a spin transfer torque writing magnetoresistive element, it is necessary to ensure the perpendicular magnetic anisotropy, reduce the damping constant, and raise the magnetoresistive ratio (MR ratio) at the same time. Known examples using a multilayer for the recording layer are patent reference 1: US 2005/0185455A1, and patent reference 2: US 2005/0104101A1. Patent reference 1 discloses Pt as a nonmagnetic layer that forms a multilayer. In this case, the damping constant is expected to be large. Patent reference 2 discloses Co/Pt, Co/Au, and Ni/Cu as multilayers. However, no practical means for ensuring the perpendicular magnetic anisotropy, reducing the damping constant, and achieving a high MR ratio at the same time is disclosed. The above conditions cannot be satisfied only by stacking Co/Au, as will be described later.

In order to achieve a low damping constant in a form of a multilayer obtained by alternately stacking a magnetic layer and a nonmagnetic layer, the present inventors examined the material of the nonmagnetic layer first. Normally, platinum (Pt) and palladium (Pd) are known as nonmagnetic materials for achieving a multilayer having the perpendicular magnetic anisotropy. However, the degree of increase in the damping constant caused by the spin pumping effect is very high in Pt. The degree of increase further rises when the magnetic layer of the multilayer is thinned. Considering magnetization reversal by spin transfer torque writing, Pt is not preferable from the viewpoint of the damping constant. Pd does not increase the damping constant as compared to Pt. However, it requires to select an appropriate magnetic material for the multilayer, as will be described later.

The present inventors took note of copper (Cu), silver (Ag), and gold (Au) each having a small spin scattering effect as nonmagnetic material candidates other than Pd. Multilayers were formed using these materials and a magnetic layer of Co. Cu and Ag yielded in-plane magnetization films. However, Au produced a perpendicular magnetic film which exhibited the perpendicular magnetic anisotropy. It is therefore preferable to select a material mainly containing palladium (Pd) or gold (Au) as the nonmagnetic material from the viewpoint of reducing the damping constant and ensuring the perpendicular magnetic anisotropy.

Next, the present inventors examined the magnetic material of a multilayer. Multilayers were formed using Pd as the nonmagnetic material. The perpendicular magnetic anisotropic energy density and its dependence on the composition of the Co—Fe alloy were measured. It was found that the perpendicular magnetic anisotropy decreased as the content of iron (Fe) increased. On the other hand, from the viewpoint of the damping constant, the Co—Fe alloy is known to have a small damping constant as the concentration of Fe increases.

The present inventors newly formed stacked films of Au/Co—Fe/Au and Pd/Co—Fe/Pd assuming palladium (Pd) and gold (Au) as the nonmagnetic material for forming a multilayer and examined the dependence of the damping constant on the composition of the Co—Fe alloy and the dependence of the damping constant on the film thickness.

Note that in the description of a stacked film, the left side of "/" represents an upper layer, and the right side of "/" represents a lower layer (substrate side).

It was found that the dependence on the composition of the Co—Fe alloy largely changed depending on the film thickness of the Co—Fe alloy (see FIG. 1). When the film thickness of the Co—Fe alloy is about 3 nm, the damping constant is minimum when the concentration of Fe is nearly 20 at % in both the film using Pd as the nonmagnetic material and that using Au. Note that "at %" represents the atomic (number) percent. If the Co—Fe alloy thins to about 1 nm, the damping constant is minimum when the concentration of Co is nearly 80 at % (i.e., the concentration of Fe is 20 at %) in the film using Pd as the nonmagnetic material. However, there is no large difference as compared to a structure containing Fe at 50 at %.

When the nonmagnetic material is Au, the damping constant is smaller at an Fe concentration of 50 at % than at 20 at %. This reason is described below. The damping constant is small when the concentration of Co is almost 80 at % (i.e., the concentration of Fe is 20 at %). However, when the Co—Fe alloy becomes thin, the damping constant at an Fe concentration of 20 at % almost equals that at 50 at % for a certain film thickness because the dependence of the damping constant in the film thickness is smaller at an Fe concentration of 50 at %. If the Co—Fe alloy becomes thinner, the damping constant tends to be smaller at an Fe concentration of 50 at %.

When the Fe concentration is 0 at %, i.e., the Co concentration is 100 at %, the dependence of the damping constant on the film thickness is conspicuous. Hence, from the viewpoint of damping constant reduction, it is not preferable to use a multilayer using cobalt (Co) as a magnetic material for the recording layer of a spin transfer torque writing element. To reduce the damping constant while maintaining the perpendicular magnetic anisotropy, a multilayer is preferably formed using a Co—Fe alloy containing Fe at 20 at % or more (i.e., Co at 80 at % or less) as a magnetic material. As is apparent from FIG. 1, Au is more preferable as a nonmagnetic material than Pd from the viewpoint of the damping constant if the film thickness is the same.

Figure 2:
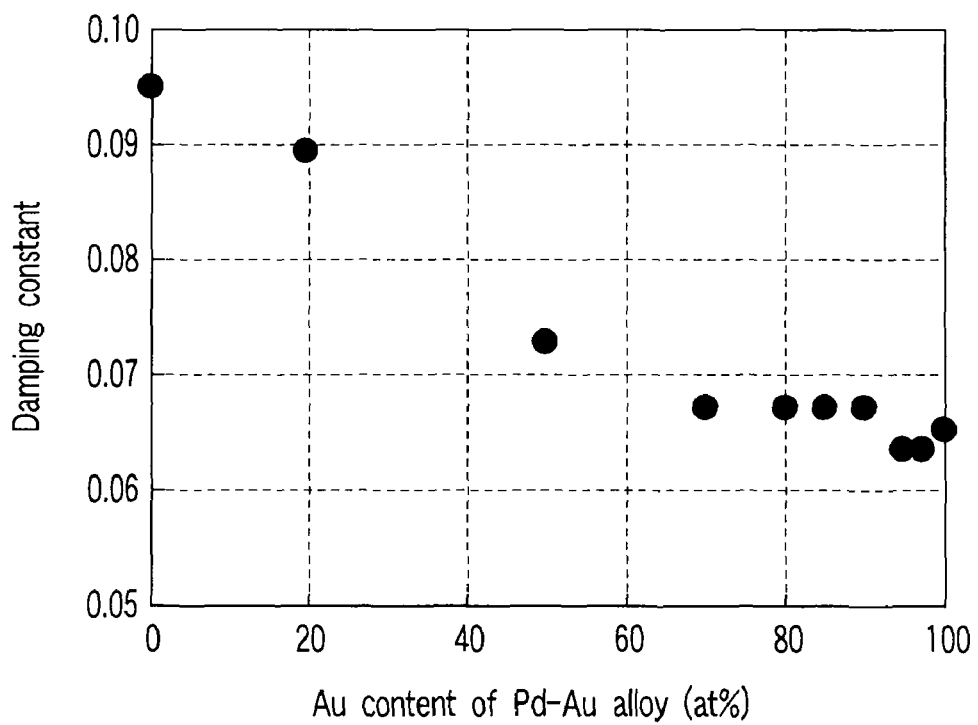
FIG. 2 is a graph illustrating the relationship between the damping constant and the composition of a Pd—Au alloy.

A Pd—Au alloy was examined as the nonmagnetic material of a multilayer. FIG. 2 shows the dependence of the damping constant on the composition of a Pd—Au alloy of a stacked structure of Pd—Au/$Co_{80}Fe_{20}$/Pd—Au. The film thickness of $Co_{80}Fe_{20}$ is about 3 nm. As shown in FIG. 2, the damping constant can be reduced by increasing the Au concentration with respect to Pd. For this reason, if a Pd—Au alloy is used as the nonmagnetic material of a multilayer, the content of Au is preferably 50 at % or more from the viewpoint of only the damping constant.

Figure 3:
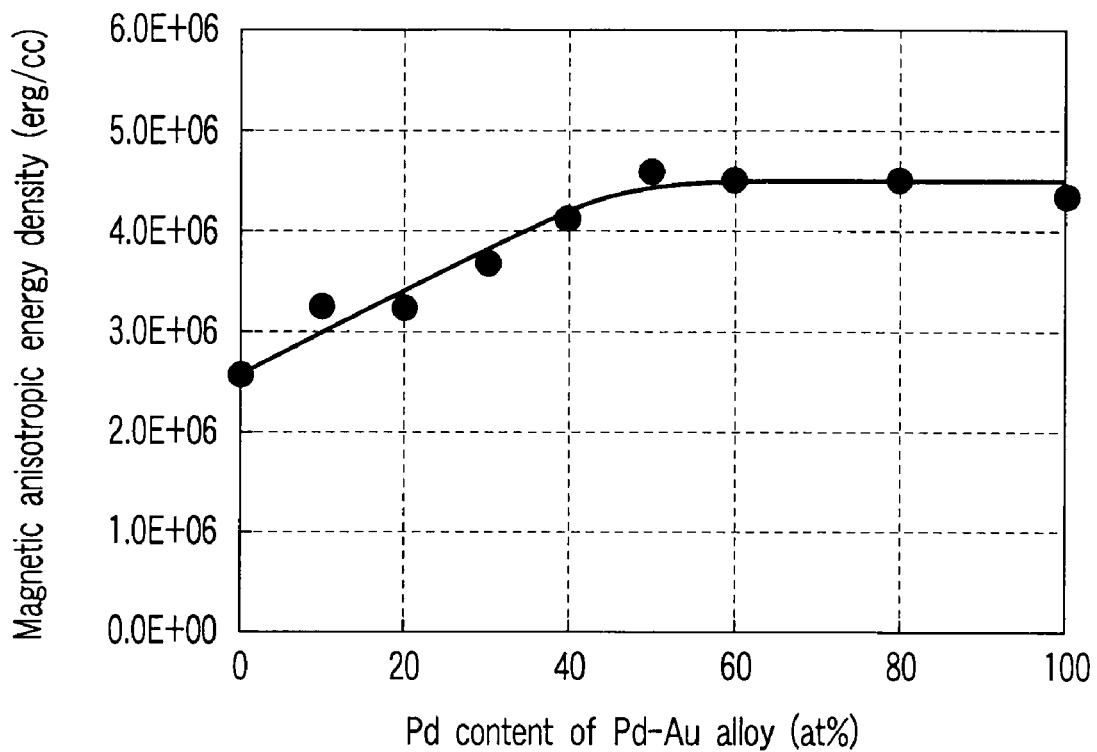
FIG. 3 is a graph illustrating the relationship between the magnetic anisotropic energy density and the composition of a Pd—Au alloy.

The magnitude of the perpendicular magnetic anisotropy of a multilayer using a Pd—Au alloy as the nonmagnetic material was examined. FIG. 3 shows a result obtained by measuring the dependence of the magnetic anisotropic energy density on the composition of a Pd—Au alloy in a stacked structure obtained by sequentially forming, on a thermally oxide substrate, a Ta film about 5 nm thick, an Ru film about 10 nm thick, a Pd film about 1 nm thick, an Au film about 4 nm thick, two cycles of [a $Co_{80}Fe_{20}$ film about 0.5 nm thick and a Pd—Au film about 1 nm thick], a $Co_{80}Fe_{20}$ film about 0.5 nm thick, and an Au film about 3 nm thick.

As shown in FIG. 3, the magnetic anisotropic energy density tends to saturate at a Pd concentration of about 50 at %. Consequently, when the Pd—Au alloy is used as a nonmagnetic material, the content of Au is most preferably about 50 at % from the viewpoint of the damping constant and the perpendicular magnetic anisotropy. A particularly excellent effect can be obtained when the Au concentration falls within the range of 45 to 55 at %. It is possible to considerably decrease the damping constant while maintaining the perpendicular magnetic anisotropy by applying the nonmagnetic material to the nonmagnetic layer of the recording layer.

Of the magnetic layers included in the multilayer of the recording layer, the first magnetic layer that contacts the first intermediate layer preferably has a particularly small damping constant. The first magnetic layer which is in contact with the first intermediate layer readily receives a spin torque because spin-polarized electrons flow into it foremost. When the first magnetic layer is Co—Fe or Co—Fe—B, the Co—Fe composition described above is applied. Considering the spin pumping effect, the first magnetic layer is preferably so thick as to maintain the perpendicular magnetization because the damping constant can be decreased.

As a magnetic material having a small damping constant, a magnetic material whose composition is $Co_2XY$ is also usable as the first magnetic layer. X contains at least one element selected from vanadium (V), chromium (Cr), manganese (Mn), iron (Fe), nickel (Ni), and copper (Cu). Y contains at least one element selected from aluminum (Al), gallium (Ga), indium (In), silicon (Si), germanium (Ge), tin (Sn), and antimony (Sb). When an alloy having this composition changes to an ordered alloy, it exhibits an $L2_1$ structure. When X and Y are irregularly substituted, a B2 structure is obtained, which has a smaller polarization than the $L2_1$ structure. When Co, X, and Y are irregularly substituted, an A2 structure (body-centered cubic structure) is obtained. The first magnetic layer preferably has the $L2_1$ structure or B2 structure from the viewpoint of the damping constant and polarization.

Normally, a giant magnetoresistive (GMR) film often uses copper (Cu) as a spacer material (intermediate layer). However, as is apparent from the result shown in FIG. 3, when forming a perpendicular magnetization GMR element, the perpendicular magnetic anisotropy is easy to ensure using not copper (Cu) but gold (Au) as the spacer material. This can also be seen from the fact that Au exhibits the perpendicular magnetic anisotropy in comparison of multilayers formed using cobalt (Co) as a magnetic material and each of copper (Cu), silver (Ag), and gold (Au) as nonmagnetic materials, as described above.

Figure 4:
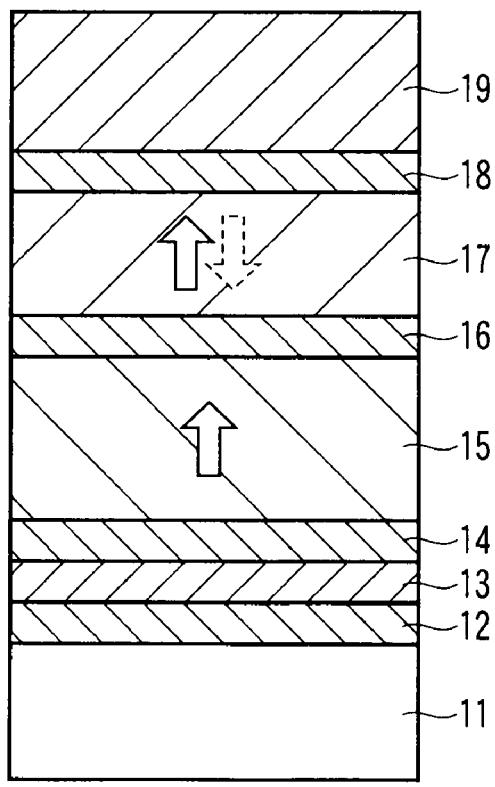
FIG. 4 is a sectional view illustrating the arrangement of a GMR element according to the first embodiment.

A spin transfer torque writing GMR element having a layer structure shown in FIG. 4 was formed. In the layer structure in FIG. 4, a Ta/Cu/Ta film serving as a low-resistance layer 12, a Ta film about 5 nm thick as an adhesive layer 13 for the low-resistance layer 12, an Ru film about 10 nm thick as an underlying layer 14 on the adhesive layer 13, a multilayer 2-nm Co/1-nm Pd/[0.3-nm Co/1-nm Pd]8 as a reference layer 15, which is obtained by stacking eight cycles of a Pd film about 1 nm thick and Co film about 0.3 nm thick and forming the magnetic layer of Co of the ninth cycle to about 2 nm, an Au film about 4 nm thick as a spacer layer 16, a multilayer 1-nm Au/0.5-nm Co/1-nm Pd/0.5-nm Co as a recording layer 17, which is obtained by stacking two cycles of a Co film about 0.5 nm thick and Pd film about 1 nm thick and forming the (uppermost) nonmagnetic layer of Au in contact with the magnetic layer farthest from the spacer layer 16 to 1 nm, and an Ru film about 5 nm thick as a protective layer 18 are sequentially formed on an Si substrate 11 with a thermal oxide film. As a hard mask 19 necessary for element processing, an Ru film about 35 nm thick and Ta film about 60 nm thick are sequentially formed.

Figure 5:
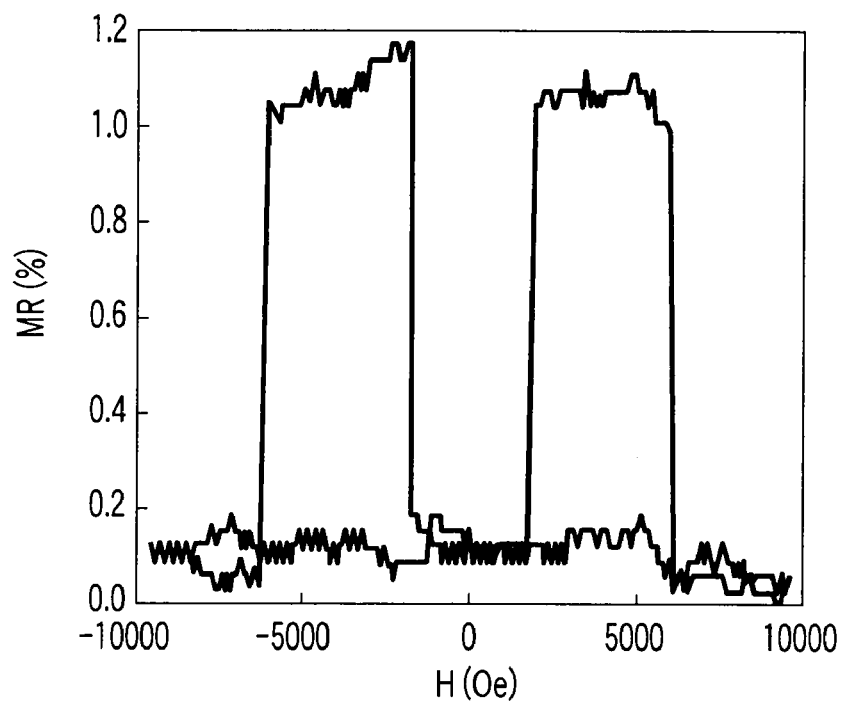
FIG. 5 is a graph illustrating the MR-H curve of the GMR element shown in FIG. 4.

FIG. 5 shows the MR-H curve of the GMR element processed to an element diameter of 80 nm. Referring to FIG. 5, the ordinate represents the MR ratio (%), and the abscissa represents a magnetic field H (Oe). As shown in FIG. 5, the GMR element exhibits a clear coercive force difference loop.

An I-H phase diagram was written, and the switching current was evaluated. When the magnetization arrangement of the reference layer 15 and recording layer 17 changed from antiparallel to parallel, the switching current density was 120 $MA/cm^3$. The switching current density to change the magnetization arrangement from parallel to antiparallel was 120 $MA/cm^3$. The coercive force without current application was 2.4 kOe, as is apparent from the I-H phase diagram.

The nonmagnetic layer of the recording layer 17 was changed from the Pd film 1 nm thick to an Au film 1 nm thick to form 1-nm Au/0.5-nm Co/1-nm Au/0.5-nm Co. Then, the switching current density to change the magnetization arrangement from antiparallel to parallel was 4.8 $MA/cm^3$. The switching current density to change the magnetization arrangement from parallel to antiparallel was 4.4 $MA/cm^3$. The coercive force without current application was 130 Oe, as is apparent from the I-H phase diagram. As expected from the damping constant, the current density normalized by the coercive force is lower when all nonmagnetic layers are Au. That is, current reduction is achieved.

The magnetic layer of the recording layer 17 was changed from Co to $Co_{80}Fe_{20}$ to form 1-nm Au/0.5-nm $Co_{80}Fe_{20}$/1-nm Pd/0.5-nm $Co_{80}Fe_{20}$. Then, the switching current density to change the magnetization arrangement from antiparallel to parallel was 2.7 $MA/cm^3$. The switching current density to change the magnetization arrangement from parallel to antiparallel was 6.1 $MA/cm^3$. The coercive force without current application was 1.8 kOe, as is apparent from the I-H phase diagram. As expected from the damping constant, the current density normalized by the coercive force is lower when the magnetic layer changes from Co to $Co_{80}Fe_{20}$. That is, current reduction is achieved.

As described above, when a multilayer is formed using Au as the nonmagnetic material and CoFe as the magnetic material and used in the recording layer, a GMR element capable of spin transfer torque reversal at a low current density can be obtained.

Figure 6:
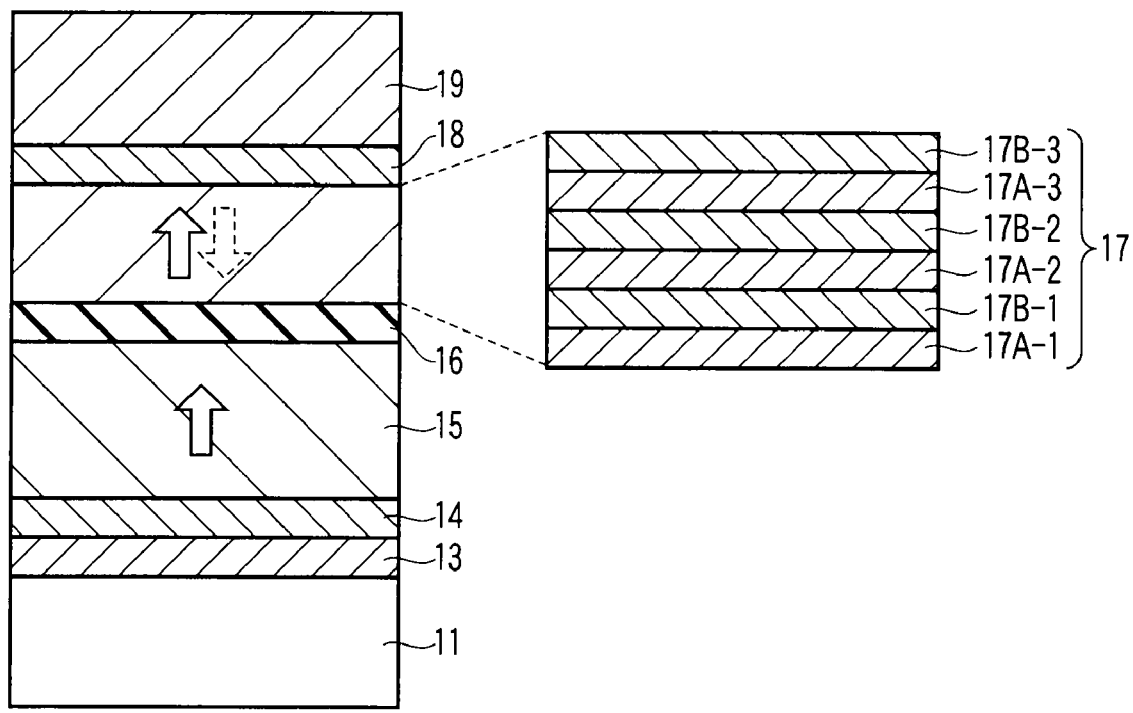
FIG. 6 is a sectional view illustrating an MTJ structure according to the first embodiment.

The present inventors made extensive studies in an MTJ structure as shown in FIG. 6 to achieve a high MR ratio. In the stacked structure shown in FIG. 6, a Ta film about 5 nm thick as an adhesive layer 13 for an underlying layer 14 was formed on an Si substrate 11 with a thermal oxide film. A $Co_{40}Fe_{40}B_{20}$ film about 3 nm thick, an MgO film about 0.5 nm thick, a TiN film about 20 nm thick, and a Pd film about 3 nm thick were sequentially formed as the underlying layer 14. An FePtB film about 10 nm thick and a $Co_{40}Fe_{40}B_{20}$ film about 2 nm thick were sequentially formed as a reference layer 15 on the underlying layer 14. The FePtB film was formed while heating the structure to 400° C. An MgO film about 1 nm thick as a tunnel barrier layer 16, a multilayer (to be described later) as a recording layer 17, and an Ru film about 5 nm thick as a protective layer 18 were sequentially formed on the reference layer 15. As a hard mask 19 necessary for element processing, a Ta film about 100 nm thick was formed.

The recording layer 17 is a multilayer [1-nm Pd/0.3-nm Co]2/1-nm Pd/1-nm CoFeB, which is obtained by stacking a CoFeB film about 1 nm thick, a Pd film about 1 nm thick, and two cycles of a Co film about 0.3 nm thick and Pd film about 1 nm thick. More specifically, the recording layer 17 is a multilayer formed by sequentially stacking a CoFeB film about 1 nm thick as a first magnetic layer 17A-1, a Pd film about 1 nm thick as a first nonmagnetic layer 17B-1, a Co film about 0.3 nm thick as a second magnetic layer 17A-2, a Pd film about 1 nm thick as a second nonmagnetic layer 17B-2, a Co film about 0.3 nm thick as a third magnetic layer 17A-3, and a Pd film about 1 nm thick as a third nonmagnetic layer 17B-3.

As the tunnel barrier layer 16, an insulator having an NaCl structure and oriented in the (100) plane is used. To achieve a high MR ratio, it is important to orient MgO as the tunnel barrier layer 16 in the (100) plane. MgO has an NaCl structure. In the forming process of the recording layer 17, after formation of the reference layer 15 and tunnel barrier layer 16, a CoFeB film 1 nm thick is formed as the first magnetic layer 17A-1 of the recording layer 17. Then, annealing is performed in a vacuum at 300° C. for 2 hours to form a crystal orientation relationship CoFeB (100)/MgO (100)/CoFeB (100), thereby achieving a high MR ratio. After the annealing process, formation starts again from the nonmagnetic material of the multilayer. An MTJ structure formed in this way can achieve an MR ratio of 100%. The crystal orientation CoFeB (100)/MgO (100)/CoFeB (100) is preferably achieved all over the film. However, for example, portions having different orientations such as a crystal grain with a different orientation plane and a stacking defect may be included without largely degrading the MR ratio.

Similarly, the recording layer 17 is a multilayer [1-nm Pd—Au/0.3-nm CoFe]2/1-nm Pd/1-nm CoFeB, which is obtained by stacking a CoFeB film about 1 nm thick, a Pd film about 1 nm thick, and two cycles of a $Co_{80}Fe_{20}$ film about 0.3 nm thick and Pd—Au alloy film about 1 nm thick. More specifically, the recording layer 17 is a multilayer formed by sequentially stacking a CoFeB film about 1 nm thick as the first magnetic layer 17A-1, a Pd film about 1 nm thick as the first nonmagnetic layer 17B-1, a $Co_{80}Fe_{20}$ film about 0.3 nm thick as the second magnetic layer 17A-2, a Pd—Au alloy film about 1 nm thick as the second nonmagnetic layer 17B-2, a $Co_{80}Fe_{20}$ film about 0.3 nm thick as the third magnetic layer 17A-3, and a Pd—Au alloy film about 1 nm thick as the third nonmagnetic layer 17B-3. The MTJ structure formed in this way can achieve an MR ratio of 90%.

To achieve a high MR ratio, the above-described recording layer 17 includes a 1-nm thick CoFeB film as a magnetic layer in contact with the tunnel barrier layer 16. If Au is used as the nonmagnetic layer, it is difficult to obtain perpendicular magnetic anisotropy. For this reason, Pd is used for the nonmagnetic layer on CoFeB. The nonmagnetic layer on it is an Au—Pd alloy containing Pd at 50 at % to further reduce the damping constant. That is, it is difficult to achieve a high MR ratio simply using Co/Au. The magnetic materials and their film thicknesses and the nonmagnetic materials and their film thicknesses of the multilayer must appropriately be set.

As the nonmagnetic layer which is in contact with the magnetic layer (CoFeB in the above example) in contact with the intermediate layer (tunnel barrier layer) may be not Pd but a Pd—Au alloy. In this case, the content of Pd in the Pd—Au alloy of the nonmagnetic layer in contact with the magnetic layer is made larger than that in the Pd—Au alloy of the nonmagnetic layer which is not in contact with the magnetic layer. For example, the content of Pd in the nonmagnetic layer in contact with the magnetic layer is set to 20 to 90 at %. The content of Pd in the nonmagnetic layer that is not in contact with the magnetic layer is set to 10 to 55 at %. In these ranges as well, it is possible to achieve a desired MR ratio while maintaining the perpendicular magnetic anisotropy.

To achieve a high MR ratio, the first magnetic layer 17A-1 in contact with the tunnel barrier layer 16 preferably has a cubic structure or a tetragonal structure and orients in the (100) plane. Hence, the first magnetic layer 17A-1 is a Co—Fe alloy containing boron (B). The concentration of boron (B) is preferably 30 at % or less because an excessively high concentration degrades the perpendicular magnetic anisotropy. More specifically, in consideration of the above-described concentration of iron (Fe), the first magnetic layer 17A-1 is an alloy $(Co_{100-x}—Fe_x)_{100-y}B_y$ containing cobalt (Co), iron (Fe), and boron (B), for which $x \geq 20$ at %, and $0 < y \leq 30$ at %.

To ensure perpendicular magnetic anisotropy and achieve a high MR ratio simultaneously, the first magnetic layer 17A-1 in contact with the tunnel barrier layer 16 is set to be thicker than the magnetic layers (17A-2 and 17A-3) which are not in contact with the tunnel barrier layer 16. More specifically, the film thickness of the first magnetic layer 17A-1 in contact with the tunnel barrier layer 16 is preferably about 0.5 to 1.5 nm, from the viewpoint of the perpendicular magnetic anisotropy and high MR ratio, while satisfying the above-described relationship. The film thicknesses of the magnetic layers (17A-2 and 17A-3) which are not in contact with the tunnel barrier layer 16 are preferably 0.2 to 1 nm, although they can be adjusted, as needed, considering the balance between the perpendicular magnetic anisotropy and the damping constant. The film thicknesses of the nonmagnetic layers (17B-1 to 17B-3) are preferably about 0.5 to 1.5 nm. An excessively large film thickness of 2 nm or more is not preferable because it weakens exchange coupling between the magnetic materials.

[2] Magnetoresistive Element (MTJ Element)

A magnetic tunnel junction (MTJ) element 10 to be used in a memory or the like can be formed by using the above-described multilayer recording layer 17. Embodiments in which the multilayer recording layer 17 is applied to the MTJ element will be explained below.

[2-1] Single-Pin Structure

Figure 7:
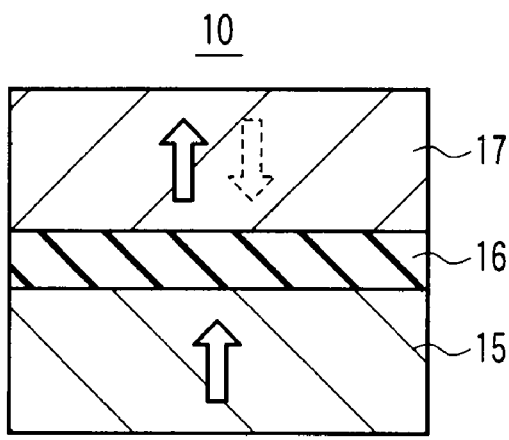
FIG. 7 is a schematic view of an MTJ element 10 having a single-pin structure according to the first embodiment.

FIG. 7 is a schematic view of the MTJ element 10 having a single-pin structure according to the first embodiment. The arrows in FIG. 7 indicate the magnetization directions. Note that the single-pin structure is a structure in which a recording layer and reference layer are stacked with an intermediate layer being interposed between them.

As shown in FIG. 7, the MTJ element 10 has a stacked structure including a reference layer (also called a pinned layer) 15 made of a magnetic material, a recording layer (also called a free layer) 17 made of a magnetic material, and an intermediate layer (nonmagnetic layer) 16 sandwiched between the reference layer 15 and recording layer 17. The MTJ element 10 is a so-called perpendicular magnetization element in which the reference layer 15 and recording layer 17 have perpendicular magnetic anisotropy, and the magnetization directions in the reference layer 15 and recording layer 17 are perpendicular to the film surfaces. Also, the magnetization (or spin) direction is fixed in the reference layer 15. In the recording layer 17, the magnetization direction is changeable (reversible).

The tunnel barrier layer 16 is an insulator, and the MTJ element 10 exhibits the tunneling magnetoresistive (TMR) effect. When the nonmagnetic layer 16 is an insulator, it is possible to use, e.g., magnesium oxide (MgO) or aluminum oxide ($AlO_x$). When the nonmagnetic layer 16 is a metal, the element is a giant magnetoresistive (GMR) element and exhibits the GMR effect. When the nonmagnetic layer 16 is a metal, it is possible to use, e.g., gold (Au), silver (Ag), or copper (Cu). In this embodiment, when the nonmagnetic layer 16 is a metal, Au is most preferably used, as described above. Use of Au for the nonmagnetic layer 16 enables to reduce the damping constant and switching current density.

(Operation)

The MTJ element 10 is a spin transfer torque writing magnetoresistive element. Accordingly, when writing data in the MTJ element 10 or reading data from the MTJ element 10, a current is supplied to the MTJ element 10 in two directions perpendicular to the film surfaces (or stacked surfaces). Also, in the MTJ element 10, the magnetization directions in the two magnetic layers (the recording layer 17 and reference layer 15) take a parallel arrangement or antiparallel arrangement. Binary 0 or 1 is made to correspond to that resistance value of the MTJ element 10, which changes in accordance with the magnetization arrangement. In this way, the MTJ element 10 can be used as a memory element.

More specifically, when supplying electrons from the reference layer 15 (i.e., when supplying electrons from the reference layer 15 to the recording layer 17), electrons spin-polarized in the same direction as the magnetization direction in the reference layer 15 are injected into the recording layer 17. In this case, the magnetization direction in the recording layer 17 is made equal to that in the reference layer 15. Consequently, the magnetization directions in the reference layer 15 and recording layer 17 take the parallel arrangement. In this parallel arrangement, the resistance value of the MTJ element 10 is smallest. This state is defined as, e.g., binary 0.

On the other hand, when supplying electrons from the recording layer 17 (i.e., when supplying electrons from the recording layer 17 to the reference layer 15), electrons spin-polarized in a direction opposite to the magnetization direction in the reference layer 15 are injected into the recording layer 17. In this case, the magnetization direction in the recording layer 17 is made opposite to that in the reference layer 15. Consequently, the magnetization directions in the reference layer 15 and recording layer 17 take the antiparallel arrangement. In this antiparallel arrangement, the resistance value of the MTJ element 10 is largest. This state is defined as, e.g., binary 1.

(Magnetic Materials)

The MTJ element 10 having a high performance can be implemented by using a magnetic layer having a large magnetization switching current as the reference layer 15, and a magnetic layer having a switching current smaller than that of the reference layer 15 as the recording layer 17. When switching magnetization by using a spin-polarized current, the switching current is proportional to the saturation magnetization, anisotropic magnetic field, and volume. Therefore, it is possible to produce a difference between the switching currents of the recording layer 17 and reference layer 15 by properly adjusting these factors.

In this embodiment, the recording layer 17 is a multilayer. The reference layer 15 can appropriately be selected from the following materials. As the magnetic material of the reference layer 15 which ensures perpendicular magnetization, a material having a magnetocrystalline anisotropy energy density of, e.g., $5 \times 10^5$ erg/cc or more is desirable. Detailed examples will be described below.

(1) Disordered Alloys

A random alloy mainly contains cobalt (Co), and also contains one or more elements selected from chromium (Cr), tantalum (Ta), niobium (Nb), vanadium (V), tungsten (W), hafnium (Hf), titanium (Ti), zirconium (Zr), platinum (Pt), palladium (Pd), iron (Fe), and nickel (Ni). Examples are CoCr, CoPt, CoCrTa, CoCrPt, CoCrPtTa, and CoCrNb. The magnetic anisotropic energy density and saturation magnetization of any of these alloys can be adjusted by increasing the ratio of the nonmagnetic element.

(2) Ordered Alloys

An ordered alloy is a ferromagnetic alloy (ordered alloy) which contains one or more elements selected from iron (Fe), cobalt (Co), and nickel (Ni) and one or more elements selected from palladium (Pd), platinum (Pt), and whose crystal structure is the $L1_0$ structure. Examples are $Fe_{50}Pt_{50}$, $Fe_{50}Pd_{50}$, $Co_{50}Pt_{50}$, $Fe_{30}Ni_{20}Pt_{50}$, $Co_{30}Fe_{20}Pt_{50}$, and $Co_{30}Ni_{20}Pt_{50}$. Note that these ordered alloys are not limited to the above composition ratios. The magnetic anisotropic energy density and saturation magnetization of any of these ordered alloys can be adjusted low by adding an insulator or an impurity element such as copper (Cu), chromium (Cr), or silver (Ag), or an alloy thereof.

(3) Multilayer

A multilayer can be used as the reference layer by appropriately adjusting the magnetic anisotropic energy density and saturation magnetization. It is possible to use a structure obtained by alternately stacking one or more elements selected from iron (Fe), cobalt (Co), and nickel (Ni) or an alloy containing one of these elements, and one element selected from chromium (Cr), platinum (Pt), palladium (Pd), iridium (Ir), rhodium (Rh), ruthenium (Ru), osmium (Os), rhenium (Re), gold (Au), and copper (Cu) or an alloy containing one of these elements. Examples of the multilayer are Co/Pt, Co/Pd, CoCr/Pt, Co/Ru, Co/Os, Co/Au, and Ni/Cu. The magnetic anisotropic energy density and saturation magnetization of any of these multilayers can be adjusted by adding an element to the magnetic layer or adjusting the film thickness ratio of the magnetic layer to the nonmagnetic layer.

(4) Ferrimagnetic Materials

As a ferrimagnetic material, an alloy containing a rare earth metal and transition metal is used. More specifically, an amorphous alloy containing terbium (Tb), dysprosium (Dy), or gadolinium (Gd) and one or more transition metals is used. Examples of the ferrimagnetic material are TbFe, TbCo, TbFeCo, DyTbFeCo, and GdTbCo. The magnetic anisotropic energy density and saturation magnetization of any of these alloys can be adjusted by adjusting the composition.

Note that the magnetic layer may have a structure in which the magnetic portion and nonmagnetic portion are separated by segregating the nonmagnetic portion. For example, an oxide, nitride, or carbide such as silicon oxide ($SiO_2$), magnesium oxide (MgO), silicon nitride (SiN), or silicon carbide (SiC) may be used as the nonmagnetic portion. An alloy such as a nonmagnetic CoCr alloy containing Cr at a high concentration of 25 at % or more may be used.

A magnetic metal layer made of one or more elements selected from iron (Fe), cobalt (Co), and nickel (Ni) or an alloy containing one of these elements may be arranged as a material having a high polarization ratio in the interface of the magnetic layer (recording layer 17 or reference layer 15) in contact with the nonmagnetic layer 16 of the MTJ element 10, thereby raising the MR ratio. However, a single magnetic metal layer normally has in-plane magnetization. It is therefore necessary to adjust the magnetic film thickness ratio to the material having perpendicular magnetic anisotropy which is stacked on the magnetic metal layer so that the stability of perpendicular magnetization does not decrease.

Each of the recording layer 17 and reference layer 15 is formed by stacking magnetic layers. One of the magnetic layers may have a so-called granular structure in which the magnetic material disperses.

Practical examples of the MTJ element 10 having the single-pin structure will be explained below.

(a) Practical Example 1-1

Figure 8:
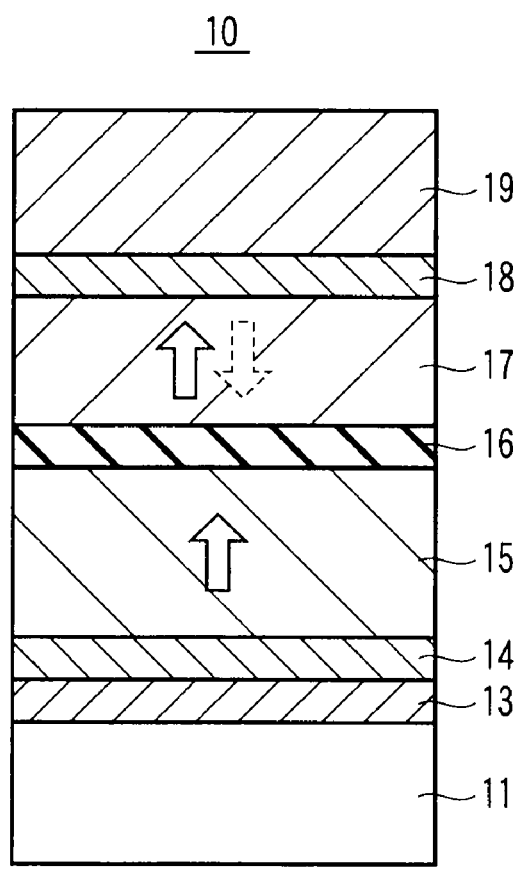
FIG. 8 is a sectional view illustrating the arrangement of an MTJ element 10 of Practical Example 1-1.

In an MTJ element 10 of Practical Example 1-1, each of a reference layer 15 and recording layer 17 is a multilayer. FIG. 8 is a sectional view illustrating the arrangement of the MTJ element 10 of Practical Example 1-1.

In the MTJ element 10 shown in FIG. 8, a Ta film about 5 nm thick as an adhesive layer 13 for an underlying layer 14, an Ru film about 10 nm thick as the underlying layer 14, a multilayer 1.5-nm CoFeB/1-nm Pt/[0.3-nm Co/1-nm Pt]8 as a reference layer 15 on the underlying layer 14, which was obtained by stacking eight cycles of a Pt film about 1 nm thick and Co film about 0.3 nm thick and forming the magnetic layer of CoFeB of the ninth cycle to about 1.5 nm, an MgO film about 1 nm thick as a tunnel barrier layer 16, a multilayer [1-nm Pd/0.3-nm CoFe]2/1-nm Pd/0.5-nm CoFe as a recording layer 17, which was obtained by stacking a $Co_{50}Fe_{50}$ film about 0.5 nm thick, a Pd film about 1 nm thick, and two cycles of a $Co_{80}Fe_{20}$ film about 0.3 nm thick and Pd film about 1 nm thick, and an Ru film about 5 nm thick as a protective layer 18 were sequentially formed on an Si substrate 11 with a thermal oxide film. As a hard mask 19 necessary for element processing, a Ta film about 100 nm thick was formed. Note that the adhesive layer 13 also functions as a lower electrode, and the hard mask 19 also functions as an upper electrode.

In the forming process of the recording layer 17, after formation of the reference layer 15 and tunnel barrier layer 16, a CoFe film 0.5 nm thick is formed as the first magnetic layer of the recording layer 17. Then, annealing is performed in a vacuum at 300° C. for 2 hours to form a crystal orientation relationship CoFe (100)/MgO (100)/CoFeB (100), thereby achieving a high MR ratio. After the annealing process, formation starts again from the nonmagnetic material of the multilayer. The MTJ element 10 of Practical Example 1-1 formed in this way achieved an MR ratio of 50%.

The arrangement of Practical Example 1-1 described above has a so-called bottom pin structure in which the reference layer 15 is formed below the tunnel barrier layer 16 (on the substrate side), and the recording layer 17 is formed above it. The arrangement of Practical Example 1-1 may also have a so-called top pin structure in which the reference layer 15 is formed above the tunnel barrier layer 16, and the recording layer 17 is formed below it (on the substrate side).

In both the bottom pin structure and top pin structure, an antiferromagnetic layer may also be formed adjacent to the reference layer 15 in order to fix magnetization in the reference layer 15 in one direction. As this antiferromagnetic layer, it is possible to use, e.g., FeMn, NiMn, PtMn, PtPdMn, RuMn, OsMn, or IrMn as an alloy of manganese (Mn) and iron (Fe), nickel (Ni), platinum (Pt), palladium (Pd), ruthenium (Ru), osmium (Os), or iridium (Ir).

(b) Practical Example 1-2

An MTJ element 10 of Practical Example 1-2 has the same arrangement as that of Practical Example 1-1 except that the reference layer 15 of Practical Example 1-1 is an FePt ordered alloy having the $L1_0$ structure.

In the MTJ element 10, a Ta film about 10 nm thick as an adhesive layer 13 for an underlying layer 14 is formed on an Si substrate 11 with a thermal oxide film. An FePtB film about 10 nm thick and $Co_{40}Fe_{40}B_{20}$ film about 2 nm thick to increase the MR ratio are stacked as a reference layer 15 on the underlying layer 14. FePtB of the reference layer 15 is formed while heating the substrate to 400° C. An MgO film about 1 nm thick as a tunnel barrier layer 16, a multilayer [1-nm Pd/0.3-nm CoFe]2/1-nm Pd/1-nm CoFeB as a recording layer 17, which was obtained by stacking a $Co_{40}Fe_{40}B_{20}$ film about 1 nm thick, a Pd film about 1 nm thick, and two cycles of a $Co_{80}Fe_{20}$ film about 0.3 nm thick and Pd film about 1 nm thick, and an Ru film about 5 nm thick as a protective layer 18 were sequentially formed on the reference layer 15. As a hard mask 19 necessary for element processing, a Ta film 100 nm thick was formed.

In the forming process of the recording layer 17, after formation of the reference layer 15 and tunnel barrier layer 16, a CoFeB film 1 nm thick is formed as the first magnetic layer of the recording layer 17. Then, annealing is performed in a vacuum at 300° C. for 2 hours to form a crystal orientation relationship CoFeB (100)/MgO (100)/CoFeB (100), thereby achieving a high MR ratio. After the annealing process, formation starts again from the nonmagnetic material of the multilayer.

The MTJ element 10 of Practical Example 1-2 formed in this way achieved an MR ratio of 90%. It is possible to form the reference layer 15 having satisfactory perpendicular magnetic anisotropy by using an ordered alloy having the $L1_0$ structure.

[2-2] Dual-Pin Structure

Figure 9:
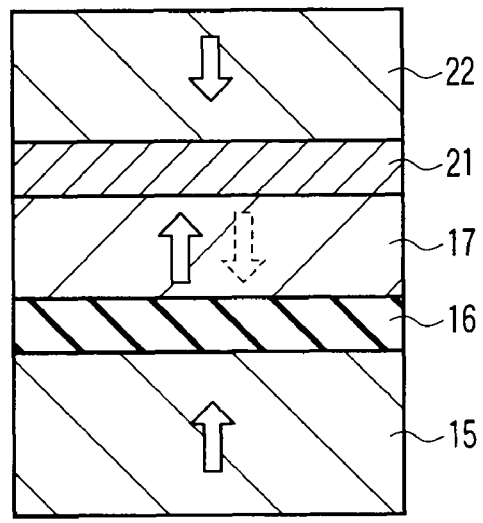
FIG. 9 is a schematic view illustrating an MTJ element 10 having a dual-pin structure according to the first embodiment.

FIG. 9 is a schematic view of the MTJ element 10 having a dual-pin structure according to the first embodiment. Note that the dual-pin structure is a structure in which two reference layers are formed on the two sides of a recording layer with intermediate layers being interposed between them.

As shown in FIG. 9, the MTJ element 10 has a stacked structure including a recording layer 17 made of a magnetic material, first and second reference layers 15 and 22 made of a magnetic material, an intermediate layer (nonmagnetic layer) 16 sandwiched between the recording layer 17 and first reference layer 15, and an intermediate layer (nonmagnetic layer) 21 sandwiched between the recording layer 17 and second reference layer 22. The MTJ element 10 is a so-called perpendicular magnetization element in which the magnetization directions in the reference layers 15 and 22 and recording layer 17 are perpendicular to the film surfaces. The first and second reference layers 15 and 22 take the antiparallel arrangement in which the magnetization directions are opposite to each other.

The nonmagnetic layers 16 and 21 are an insulator such as magnesium oxide (MgO) or aluminum oxide ($AlO_x$), a metal such as gold (Au), silver (Ag), or copper (Cu), or an alloy thereof. In this embodiment, when the nonmagnetic layer is a metal, Au is most preferable. It is possible to reduce the switching current density by using Au for the nonmagnetic layer.

In the MTJ element 10 having the dual-pin structure, the two magnetic layers (the recording layer 17 and reference layer 15) sandwiching the nonmagnetic layer 16 and the two magnetic layers (the recording layer 17 and reference layer 22) sandwiching the nonmagnetic layer 21 take the parallel or antiparallel arrangement. In the whole MTJ element 10, however, the parallel and antiparallel arrangements exist at the same time. This makes it necessary to produce a difference between the MR ratios obtained via the nonmagnetic layers 16 and 21.

Accordingly, when the nonmagnetic layer 16 is a tunnel barrier layer, and the nonmagnetic layer 21 is a metal (spacer layer), the MR ratio generated in the tunnel barrier layer 16 is higher than that generated in the nonmagnetic layer 21. Therefore, the magnetization arrangement of the two magnetic layers (the recording layer 17 and reference layer 15) sandwiching the tunnel barrier layer 16 is made to correspond to binary 0 or 1.

Note that the same materials as those of the above-described single-pin structure are usable for the recording layer 17 and reference layers 15 and 22.

(Operation)

The operation of the MTJ element 10 having the dual-pin structure will be explained below. When writing data in the MTJ element 10 or reading data from the MTJ element 10, a current is supplied to the MTJ element 10 in two directions perpendicular to the film surfaces (or stacked surfaces).

When supplying electrons from the reference layer 15 (i.e., when supplying electrons from the reference layer 15 to the recording layer 17), electrons spin-polarized in the same direction as the magnetization direction in the reference layer 15 and electrons spin-polarized in a direction opposite to the magnetization direction in the reference layer 22 as they are reflected by the reference layer 22 are injected into the recording layer 17. In this case, the magnetization direction in the recording layer 17 is made equal to that in the reference layer 15. Consequently, the magnetization directions in the reference layer 15 and recording layer 17 take the parallel arrangement. In this parallel arrangement, the resistance value of the MTJ element 10 is smallest. This state is defined as, e.g., binary 0.

On the other hand, when supplying electrons from the reference layer 22 (i.e., when supplying electrons from the reference layer 22 to the recording layer 17), electrons spin-polarized in the same direction as the magnetization direction in the reference layer 22 and electrons spin-polarized in a direction opposite to the magnetization direction in the reference layer 15 as they are reflected by the reference layer 15 are injected into the recording layer 17. In this case, the magnetization direction in the recording layer 17 is made opposite to that in the reference layer 15. In this antiparallel arrangement, the resistance value of the MTJ element 10 is largest. This state is defined as, e.g., binary 1.

As described above, when the MTJ element 10 has the dual-pin structure in which the reference layers 15 and 22 are formed on the two sides of the recording layer 17, it is possible to more efficiently use the effect of reflection of the spin-polarized electrons. As a consequence, the magnetization switching current can be reduced more than in the single-pin structure.

Practical examples of the MTJ element 10 having the dual-pin structure will be explained below.

(a) Practical Example 2-1

Figure 10:
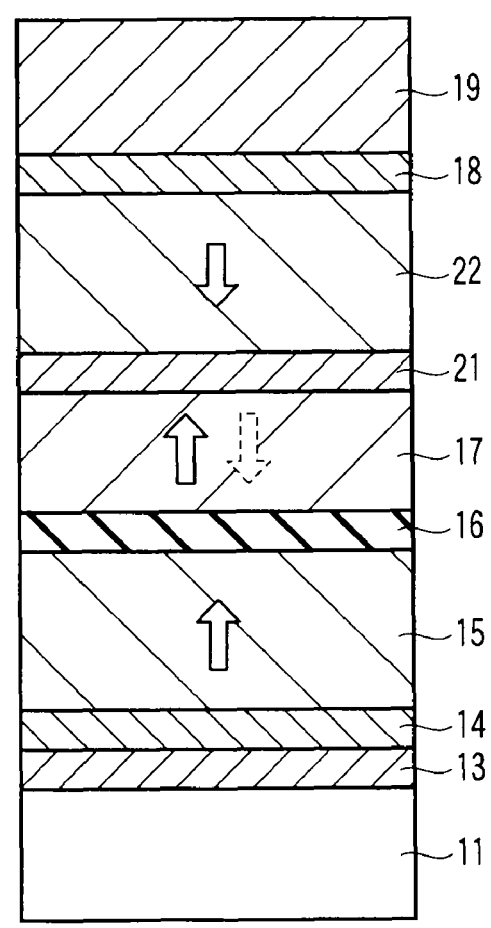
FIG. 10 is a sectional view illustrating the arrangement of an MTJ element 10 of Practical Example 2-1.

In an MTJ element 10 of Practical Example 2-1, each of reference layers 15 and 22 and a recording layer 17 is a multilayer. FIG. 10 is a sectional view illustrating the arrangement of the MTJ element 10 of Practical Example 2-1.

In the MTJ element 10, a Ta film about 5 nm thick as an adhesive layer 13 for an underlying layer 14, an Ru film about 10 nm thick as the underlying layer 14, a multilayer 1.5-nm CoFeB/1-nm Pd/[0.3-nm Co/1-nm Pd]8 as the reference layer 15 on the underlying layer 14, which was obtained by stacking eight cycles of a Pd film about 1 nm thick and Co film about 0.3 nm thick and forming the magnetic layer of CoFeB of the ninth cycle to about 1.5 nm, an MgO film about 1 nm thick as a tunnel barrier layer 16, and a multilayer [1-nm Pd/0.3-nm CoFe]2/1-nm Pd/1-nm CoFeB as the recording layer 17, which was obtained by stacking a $Co_{40}Fe_{40}B_{20}$ film about 1 nm thick, a Pd film about 1 nm thick, and two cycles of a $Co_{80}Fe_{20}$ film about 0.3 nm thick and Pd film about 1 nm thick were sequentially formed on an Si substrate 11 with a thermal oxide film.

In the forming process of the recording layer 17, after formation of the reference layer 15 and tunnel barrier layer 16, a CoFeB film 1 nm thick is formed as the first magnetic layer of the recording layer 17. Then, annealing is performed in a vacuum at 300° C. for 2 hours to form a crystal orientation relationship CoFeB (100)/MgO (100)/CoFeB (100), thereby achieving a high MR ratio. After the annealing process, the Pd film about 1 nm thick and [1-nm Pd/0.3-nm CoFe]2 of the multilayer are sequentially formed.

An Au film about 4 nm thick as a spacer layer 21, a multi-layer [0.5-nm CoFe/1-nm Pt]7 as a reference layer 22, which was obtained by stacking seven cycles of a CoFe film about 0.5 nm thick and a Pt film about 1 nm thick, and an Ru film about 5 nm thick as a protective layer 18 were sequentially formed on the recording layer 17. As a hard mask 19 necessary for element processing, a Ta film about 100 nm thick was formed.

The coercive force of the reference layer 22 is larger than that of the reference layer 15, and the magnetization directions in the reference layers 15 and 22 can be set antiparallel to each other by using this coercive force difference. That is, magnetization need only be performed twice. First magnetic field application makes the magnetization direction in the reference layer 15 and the magnetization directions in the recording layer 17 and reference layer 22 equal. After that, second magnetic field application is performed in a direction opposite to that of the first magnetic field application. The second applied magnetic field is set larger than the coercive force of the reference layer 15 and smaller than the coercive force of the reference layer 22. This makes the magnetization directions in the recording layer 17 and reference layer 15 opposite to that in the reference layer 22. In this manner, the magnetization arrangement as shown in FIG. 10 can be achieved.

In the arrangement of Practical Example 2-1, the change in magnetoresistance obtained via MgO of the tunnel barrier layer 16 is larger than that in magnetoresistance obtained via Au of the spacer layer 21. The MTJ element 10 stores information by the magnetization arrangement in the recording layer 17 and reference layer 15, and that in the recording layer 17 and reference layer 22. Note that a magnetic material having a high polarization ratio may also be formed as an interface layer in the interface between the recording layer 17 and tunnel barrier layer 16, and in the interface between the recording layer 17 and spacer layer 21. Note also that the spacer layer 21 may also be an insulator such as magnesium oxide (MgO) or aluminum oxide ($AlO_x$). In this case, no problem arises in the operation if the resistance and MR ratio of the spacer layer 21 are made lower than those of the tunnel barrier layer 16.

In the above-described MTJ element 10, the reference layer 22 may have a two-layer structure of a $Tb_{30}(Co_{80}Fe_{20})_{70}$ film about 30 nm thick and Fe film about 2 nm thick. $Tb_{30}(Co_{80}Fe_{20})_{70}$ is the compensation composition. In this case, the magnetic moment of the rare earth (RE) metal in the reference layer 22 is large. The magnetic moment of RE is large even in the whole reference layer 22 including the stacked Fe film. In this case, the same magnetization arrangement as in the reference layers 15 and 22 in FIG. 10 can be achieved by performing magnetization only once in one direction. More specifically, the magnetic moment of the transition metal (TM) in the reference layer 22 is smaller than that of RE. The magnetic moment of the transition metal (TM) is opposite to that of RE. For these reasons, the magnetization in the reference layer 22 points in a direction opposite to the direction of magnetization.

The reference layers 15 and 22 can appropriately be selected from an ordered alloy, random alloy, multilayer, and ferrimagnetic material, as described previously in Practical Examples 1-1 and 1-2.

Note that antiferromagnetic layers may also be formed adjacent to the reference layers 15 and 22 in order to fix the magnetization directions in these layers in one direction. As these antiferromagnetic layers, it is possible to use, e.g., FeMn, NiMn, PtMn, PtPdMn, RuMn, OsMn, or IrMn as an alloy of manganese (Mn) and iron (Fe), nickel (Ni), platinum (Pt), palladium (Pd), ruthenium (Ru), osmium (Os), or iridium (Ir).

(b) Practical Example 2-2

Figure 11:
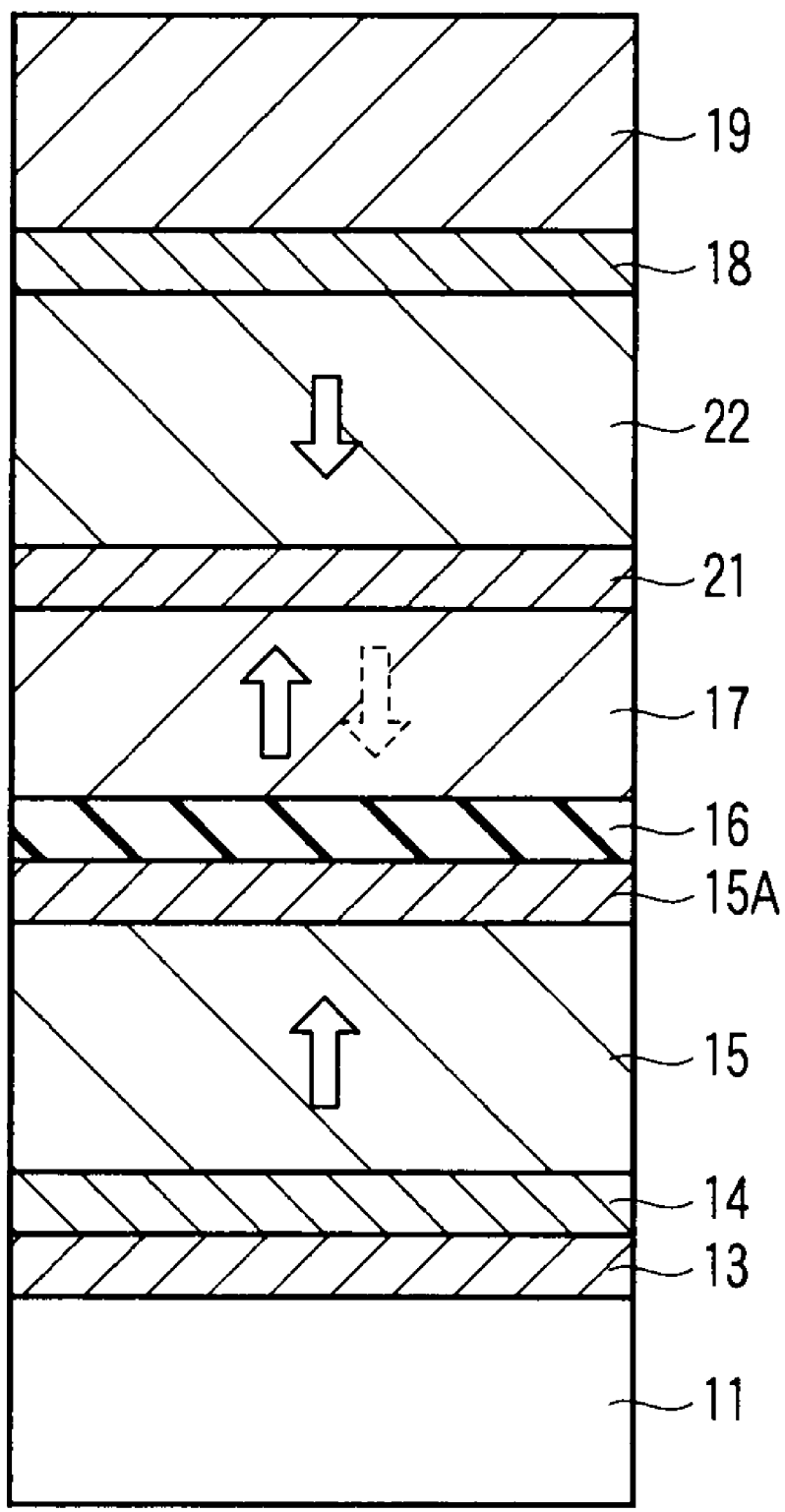
FIG. 11 is a sectional view illustrating the arrangement of an MTJ element 10 of Practical Example 2-2.

In an MTJ element 10 of Practical Example 2-2, a reference layer 15 is an FePt ordered alloy having the $L1_0$ structure. Additionally, a TMR structure is formed in the lower portion (on the substrate side), and a GMR structure is formed in the upper portion. FIG. 11 is a sectional view illustrating the arrangement of the MTJ element 10 of Practical Example 2-2.

In the MTJ element 10, a Ta film about 10 nm thick as an adhesive layer 13 for an underlying layer 14, an Ru film about 10 nm thick as the underlying layer 14, an FePtB film about 10 nm thick as the reference layer 15 on the underlying layer 14, a $Co_{40}Fe_{40}B_{20}$ film about 2 nm thick as an interface layer 15A to increase the MR ratio, an MgO film about 2 nm thick as a tunnel barrier layer 16, and a multilayer [1-nm Pd/0.3-nm CoFe]2/1-nm Pd/1-nm CoFeB as a recording layer 17, which was obtained by stacking a CoFeB film about 1 nm thick, a Pd film about 1 nm thick, and two cycles of a $Co_{80}Fe_{20}$ film about 0.3 nm thick and Pd film about 1 nm thick were sequentially formed on an Si substrate 11 with a thermal oxide film.

Note that the reference layer 15 and interface layer 15A behave as one magnetic layer (reference layer) because they are coupled by exchange coupling. To achieve a high MR ratio, the interface layer 15A in contact with the tunnel barrier layer 16 preferably has a cubic structure or a tetragonal structure and orients in the (100) plane. Hence, the interface layer 15A is a CoFe alloy containing boron (B). The concentration of boron (B) is preferably 30 at % or less because an excessively high concentration degrades the perpendicular magnetic anisotropy. More specifically, the interface layer 15A is an alloy $(Co_{100-x}—Fe_x)_{100-y}B_y$ containing cobalt (Co), iron (Fe), and boron (B), for which $x \geq 20$ at %, and $0 < y \leq 30$ at %.

In the forming process of the recording layer 17, after formation of the reference layer 15, interface layer 15A, and tunnel barrier layer 16, a CoFeB film 1 nm thick is formed as the first magnetic layer of the recording layer 17. Then, annealing is performed in a vacuum at 300° C. for 2 hours to form a crystal orientation relationship CoFeB (100)/MgO (100)/CoFeB (100), thereby achieving a high MR ratio. After the annealing process, a Pd film about 1 nm thick and [1-nm Pd/0.3-nm CoFe]2 are sequentially formed.

An Au film about 4 nm thick as a spacer layer 21, a multilayer [0.3-nm Co/1-nm Pt]7 as a reference layer 22, which was obtained by stacking seven cycles of a Pt film about 1 nm thick and Co film about 0.3 nm thick, and an Ru film about 5 nm thick as a protective layer 18 were sequentially formed on the recording layer 17. As a hard mask 19 necessary for element processing, an Ru film about 35 nm thick and Ta film about 60 nm thick were sequentially formed.

It is possible to form the reference layer 15 having satisfactory perpendicular magnetic anisotropy by using a ferromagnetic alloy (ordered alloy) having the $L1_0$ structure. The reference layer 22 may be an ordered alloy giving the $L1_0$ structure. Antiferromagnetic layers may also be formed adjacent to the reference layers 15 and 22 in order to fix the magnetization directions in these layers in one direction.

(c) Practical Example 2-3

In an MTJ element 10 of Practical Example 2-3, a TMR structure of a tunnel barrier layer is formed in the upper portion, and a GMR structure is formed in the lower portion (on the substrate side). FIG. 12 is a sectional view illustrating the arrangement of the MTJ element 10 of Practical Example 2-3.

After formation up to a reference layer 15 was ended, as in Practical Example 2-1, an Au film about 4 nm thick as a spacer layer 16, and a CoFe film about 0.5 nm thick, an Au—Pd film about 1 nm thick, and $Co_{40}Fe_{40}B_{20}$ film about 1 nm thick as a recording layer 17 were sequentially formed. An MgO film about 1 nm thick as a tunnel barrier layer 21 was formed on the recording layer 17. After the tunnel barrier layer 21, the same structure as in Practical Example 2-1 was sequentially formed.

The reference layers 15 and 22 can appropriately be selected from an ordered alloy, random alloy, multilayer, and ferrimagnetic material, as described previously in Practical Examples 1-1 and 1-2. Antiferromagnetic layers may also be formed adjacent to the reference layers 15 and 22 in order to fix the magnetization directions in these layers in one direction.

(d) Practical Example 2-4

Figure 13:
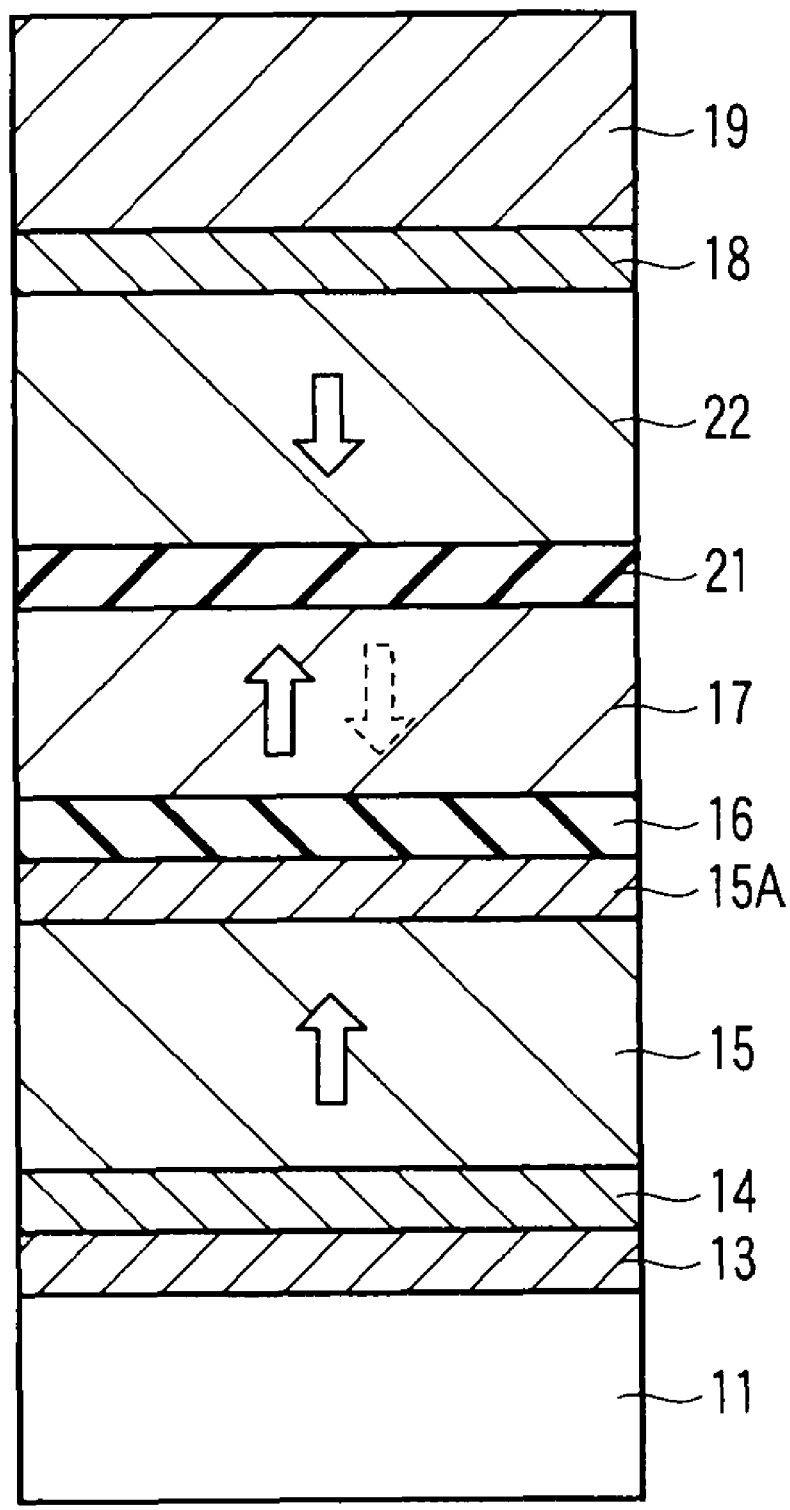
FIG. 13 is a sectional view illustrating the arrangement of an MTJ element 10 of Practical Example 2-4.

In an MTJ element 10 of Practical Example 2-4, intermediate layers (nonmagnetic layers) 16 and 21 are an insulator, and TMR structures are formed in both the lower portion (on the substrate side) and upper portion. FIG. 13 is a sectional view illustrating the arrangement of the MTJ element 10 of Practical Example 2-4. The MTJ element 10 of Practical Example 2-4 has the same arrangement as that of Practical Example 2-2 except that the nonmagnetic layer 21 is an insulator, and a reference layer 22 has a stacked structure of CoFeB and TbCoFe.

After formation up to a recording layer 17 was ended, as in Practical Example 2-2, an MgO film about 1 nm thick as the tunnel barrier layer 21, and a stacked structure of a $Co_{40}Fe_{40}B_{20}$ film about 2 nm thick and $Tb_{30}(Co_{80}Fe_{20})_{70}$ film about 30 nm thick as a reference layer 22 were sequentially formed on the recording layer 17. $Tb_{30}(Co_{80}Fe_{20})_{70}$ is the compensation composition.

An Ru film about 5 nm thick as a protective layer 18, and an Ru film about 35 nm thick and Ta film about 60 nm thick as a hard mask 19 necessary for element processing were sequentially formed on the reference layer 22. Antiferromagnetic layers may also be formed adjacent to the reference layers 15 and 22 in order to fix the magnetization directions in these layers in one direction.

In the MTJ element 10 of Practical Example 2-4, a tunnel barrier layer 16 is an MgO film about 2 nm thick, whereas the film thickness of MgO of the tunnel barrier layer 21 is 1 nm. Therefore, the resistance difference is large, and the magnetoresistive ratio of the tunnel barrier layer 16 is dominant.

(e) Practical Example 2-5

Figure 14:
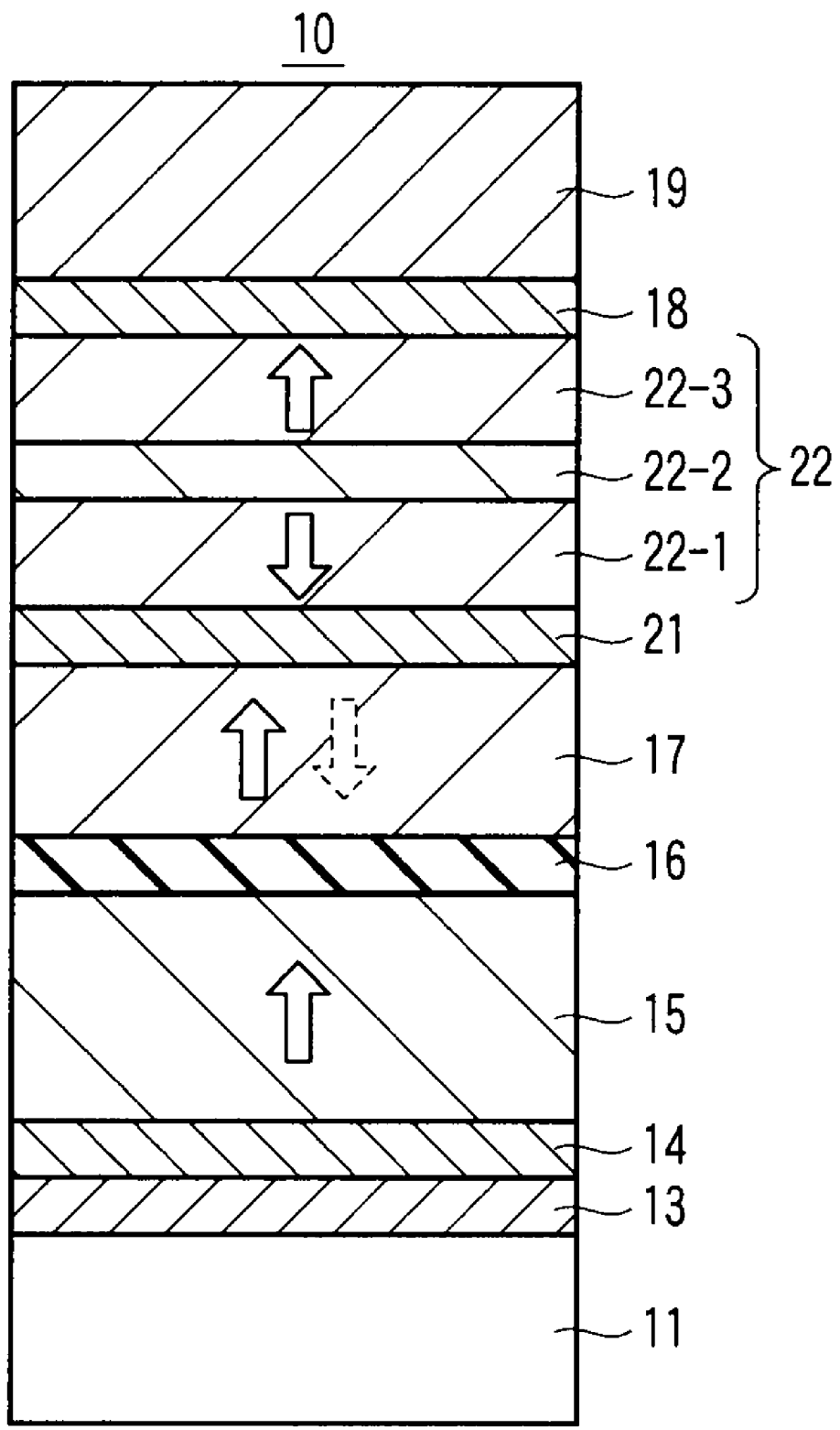
FIG. 14 is a sectional view illustrating the arrangement of an MTJ element 10 of Practical Example 2-5.

FIG. 14 is a sectional view illustrating the arrangement of an MTJ element 10 of Practical Example 2-5. The MTJ element 10 of Practical Example 2-5 has the same arrangement as that of Practical Example 2-1 except that a reference layer 22 has the synthetic anti-ferromagnetic (SAF) structure. A TMR structure is formed in the lower portion (on the substrate side), and a GMR structure is formed in the upper portion. The SAF structure is a structure in which two magnetic layers are coupled by antiferromagnetic exchange coupling. The reference layer 22 includes a first magnetic layer 22-1, a second magnetic layer 22-3, and a nonmagnetic layer 22-2 sandwiched between the first and second magnetic layers 22-1 and 22-3. In this SAF structure, the first and second magnetic layers 22-1 and 22-3 are coupled by antiferromagnetic exchange coupling.

In this case, the magnetization directions in the first and second magnetic layers 22-1 and 22-3 take the antiparallel arrangement, so the leakage magnetic fields from the first and second magnetic layers 22-1 and 22-3 cancel out each other. This effectively reduces the leakage magnetic field from the reference layer 22. Also, magnetic layers coupled by exchange coupling has the effect of increasing the thermal disturbance resistance by increasing the volume. An example of the material of the nonmagnetic layer 22-2 is one element selected from ruthenium (Ru), osmium (Os), rhenium (Re), and rhodium (Rh), or an alloy containing at least one of these elements.

The layer structure of the MTJ element 10 of Practical Example 2-5 will be explained below. The arrangement from a substrate 11 to a recording layer 17 is the same as that of Practical Example 1-1.

After an Au film about 4 nm thick as a spacer layer 21 was formed, a multilayer [Pt/Co]4 obtained by stacking four cycles of a Pt film about 1 nm thick and Co film about 0.3 nm thick was formed as the first magnetic layer 22-1 of the reference layer 22. Then, to achieve antiferromagnetic exchange coupling, an Ru film about 0.9 nm thick was formed as the nonmagnetic layer 22-2, and a multilayer [Co/Pt]5 obtained by stacking five cycles of a Co film about 0.3 nm thick and Pt film about 1 nm thick was formed as the second magnetic layer 22-3.

Note that the antiferromagnetic coupling can be achieved even when the first and second magnetic layers 22-1 and 22-3 are a ferrimagnetic RE-TM alloy. In this case, the nonmagnetic layer 22-2 need not be formed. An example will be explained below with reference to FIGS. 15 and 16.

The RE-TM alloy is in a state in which the magnetic moment of a rare earth (RE) metal and that of a transition metal (TM) are antiferromagnetically coupled. When the RE-TM alloys are stacked, RE portions ferromagnetically couple with each other, and TM portions ferromagnetically couple with each other. In this case, the magnetic moments of the RE and TM cancel out each other, so the magnetic moment as the RE-TM alloy can be adjusted by the composition.

For example, as shown in FIG. 15, in an RE-TM alloy layer 22-1 in which a magnetic moment 41 of the RE is larger than a magnetic moment 42 of the TM, a remaining magnetic moment 43 points in the same direction as that of the magnetic moment 41 of the RE. When an RE-TM alloy layer 22-3 in which a magnetic moment 44 of the RE is larger than a magnetic moment 45 of the TM is stacked on the RE-TM alloy layer 22-1, the magnetic moments 41 and 44 of the RE point in the same direction, and the magnetic moments 42 and 45 of the TM point in the same direction. Consequently, the magnetic moment 43 and a magnetic moment 46 in the two RE-TM alloy layers 22-1 and 22-3 point in the same direction, i.e., take the parallel state.

By contrast, as shown in FIG. 16, when the RE-TM alloy layer 22-3 in which the magnetic moment 44 of the RE is smaller than the magnetic moment 45 of the TM is stacked on the RE-TM alloy layer 22-1, the magnetic moments 43 and 46 in the two RE-TM alloy layers 22-1 and 22-3 take the antiparallel state.

For example, when the content of Tb is 22 at % in a Tb—Co alloy, the magnetic moments of Tb and Co become equal, resulting in a so-called compensation composition by which the magnetic moment is almost zero. These magnetic moments become antiparallel when a $Tb_{25}Co_{75}$ film about 10 nm thick and $Tb_{20}Co_{80}$ film about 10 nm thick are stacked.

A reference layer 22 in which two magnetic layers 22-1 and 22-3 are coupled in the antiparallel state can be formed by using the above form. For example, the first magnetic layer 22-1 of the reference layer 22 is a $Tb_{26}(Fe_{71}Co_{29})_{74}$ film about 15 nm thick, and the second magnetic layer 22-3 of the reference layer 22 is a $Tb_{22}(Fe_{71}Co_{29})_{78}$ film about 20 nm thick. In this case, $Tb_{24}(Fe_{71}Co_{29})_{76}$ is the compensation composition.

In the MTJ element 10 having the above arrangement, the same magnetization arrangement as that of the reference layers 15 and 22 shown in FIG. 9 can be achieved by performing magnetization in one direction only once. That is, in the reference layer 22, the magnetic moment of the TM is smaller than that of the RE, and points in a direction opposite to that of the magnetic moment of the RE. Therefore, magnetization in the reference layer 22 points in a direction opposite to the magnetizing direction.

When the first and second magnetic layers 22-1 and 22-3 are the RE-TM alloy, it is also possible to achieve the antiferromagnetic coupling by forming the nonmagnetic layer 22-2 between the first and second magnetic layers 22-1 and 22-3. An example will be explained below with reference to FIGS. 17 and 18.

The magnetic moments 42 and 45 of the TM in the first and second magnetic layers 22-1 and 22-3 shown in FIG. 17 presumably couple with each other by exchange coupling through the nonmagnetic layer 22-2. Similarly, the magnetic moments 42 and 45 of the TM in the first and second magnetic layers 22-1 and 22-3 shown in FIG. 18 presumably couple with each other by exchange coupling through the nonmagnetic layer 22-2.

For example, as shown in FIG. 17, when a metal that antiferromagnetically couples with Co is used as the nonmagnetic layer 22-2, the magnetic moment 41 of the RE is made larger than the magnetic moment 42 of the TM in the RE-TM alloy layer 22-1, and the magnetic moment 44 of the RE is made larger than the magnetic moment 45 of the TM in the RE-TM alloy layer 22-3. That is, when the nonmagnetic layer 22-2 contributes to the antiferromagnetic coupling, the relationship between the magnitudes of the magnetic moment 42 of the TM and the magnetic moment 41 of the RE is set equal to that between the magnitudes of the magnetic moment 45 of the TM and the magnetic moment 44 of the RE. Consequently, the magnetic moments of the TM and RE cancel out each other, so the magnetic moments 43 and 46 become antiparallel. Note that an example of the material of the nonmagnetic layer 22-2 which antiferromagnetically couples with Co is one element selected from ruthenium (Ru), osmium (Os), rhenium (Re), and rhodium (Rh), or an alloy containing at least one of these elements.

Figure 18:
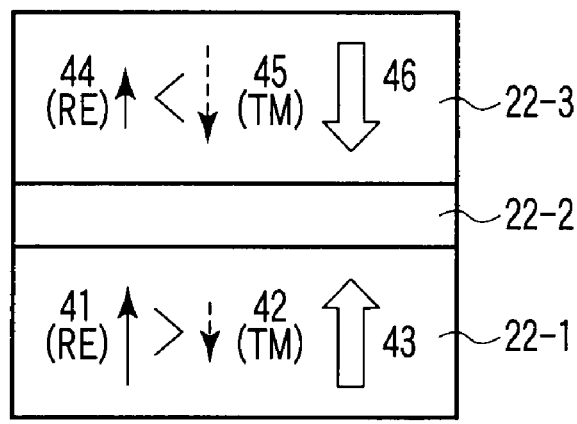
FIG. 18 is a view for explaining still another example of the arrangement of the reference layer 22.

Also, as shown in FIG. 18, when a metal that ferromagnetically couples with Co is used as the nonmagnetic layer 22-2, the magnetic moment 41 of the RE is made larger than the magnetic moment 42 of the TM in the RE-TM alloy layer 22-1, and the magnetic moment 44 of the RE is made smaller than the magnetic moment 45 of the TM in the RE-TM alloy layer 22-3. That is, when the nonmagnetic layer 22-2 contributes to the antiferromagnetic coupling, the relationship between the magnitudes of the magnetic moment 42 of the TM and the magnetic moment 41 of the RE is set opposite to that between the magnitudes of the magnetic moment 45 of the TM and the magnetic moment 44 of the RE. Consequently, the magnetic moments of the TM and RE cancel out each other, so the magnetic moments 43 and 46 become antiparallel. Note that an example of the material of the nonmagnetic layer 22-2 which ferromagnetically couples with Co is one or more elements selected from platinum (Pt) and palladium (Pd), or an alloy containing at least one of these elements.

Moreover, the reference layer 22 may also be formed by stacking an RE-TM alloy in which the magnetic moment of the RE is larger than that of the TM, and a metal or alloy mainly containing a transition metal.

In the first embodiment as described in detail above, the recording layer 17 is a multilayer formed by alternately stacking magnetic layers and nonmagnetic layers. The magnetic layers included in the recording layer 17 are an alloy containing cobalt (Co) and iron (Fe). At least one of the nonmagnetic layers included in the recording layer 17 is an alloy containing palladium (Pd) and gold (Au). Of the magnetic layers included in the recording layer 17, the magnetic layer 17A-1 in contact with the tunnel barrier layer 16 is an alloy containing cobalt (Co), iron (Fe), and boron (B). The film thickness of the magnetic layer in contact with the tunnel barrier layer 16 is set to be larger than that of any magnetic layer that is not in contact with the tunnel barrier layer 16. This allows to form the recording layer 17 capable of ensuring the perpendicular magnetic anisotropy, reducing the damping constant (i.e., reducing the write current), and achieving a high MR ratio.

An insulator having an NaCl structure represented by MgO is used as the tunnel barrier layer 16. The interface layer 15A made of an alloy containing cobalt (Co), iron (Fe), and boron (B) is arranged between the tunnel barrier layer 16 and reference layer 15. This allows to form a crystal orientation relationship CoFeB (100)/MgO (100)/CoFeB (100). It is therefore possible to achieve a high MR ratio.

As the magnetic layers included in the recording layer 17, a Co—Fe alloy containing iron (Fe) at 20 at % or more is used. This enables to reduce the damping constant while maintaining the perpendicular magnetic anisotropy of the recording layer 17.

It is possible to form the reference layer 15 having satisfactory perpendicular magnetic anisotropy by using an ordered alloy having the $L1_0$ structure.

When the multilayer is used for the recording layer, the spacer layer arranged between the recording layer and reference layer is formed using gold (Au). This achieves a GMR structure capable of spin transfer torque reversal at a low current density.

Second Embodiment

The second embodiment is an example in which an MRAM is formed by using the MTJ element 10 according to the first embodiment.

Figure 19:
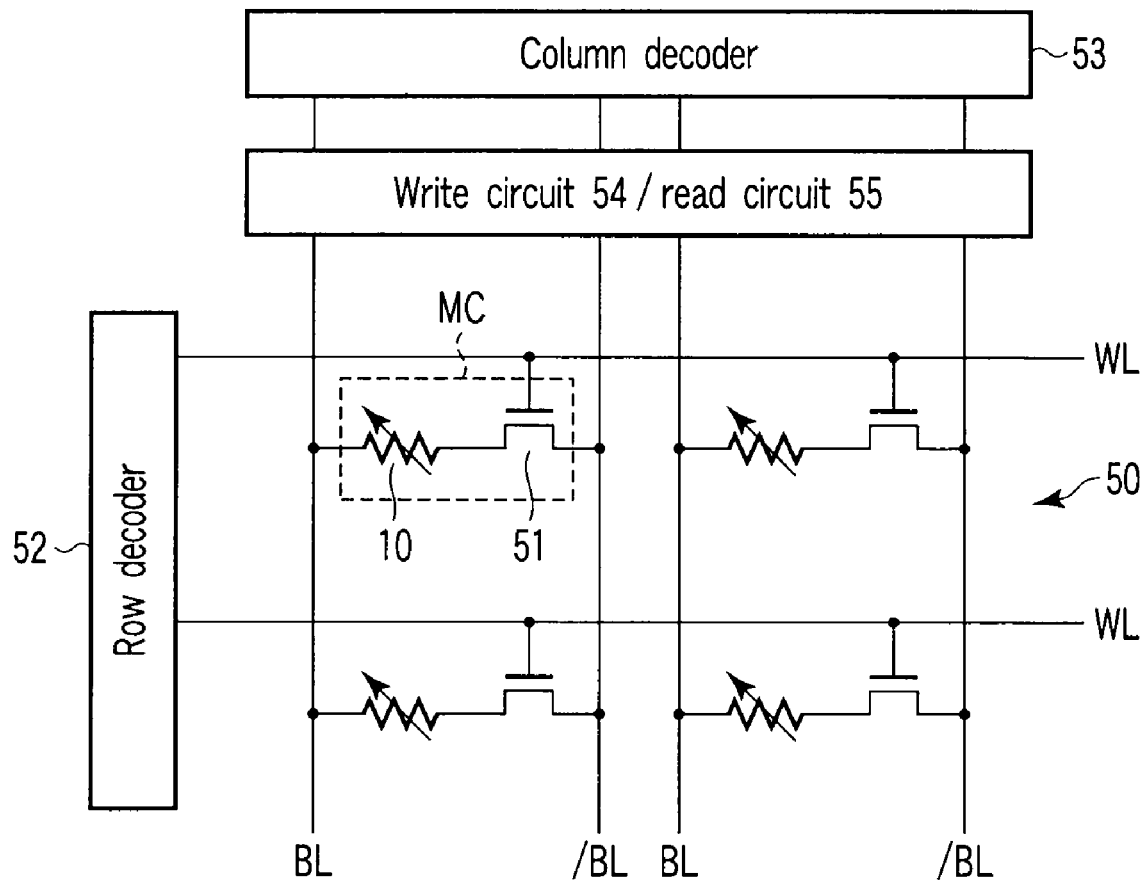
FIG. 19 is a circuit diagram illustrating the arrangement of an MRAM according to the second embodiment.

FIG. 19 is a circuit diagram illustrating the arrangement of the MRAM according to the second embodiment of the present invention. This MRAM has a memory cell array 50 including memory cells MC arranged in a matrix. In the memory cell array 50, bit line pairs BL and /BL are formed such that each bit line runs in the column direction. Also, word lines WL are formed in the memory cell array 50 such that each word line runs in the row direction.

The memory cells MC are arranged at the intersections of the bit lines BL and word lines WL. Each memory cell MC comprises the MTJ element 10, and a selection transistor 51 that is an N-channel MOS transistor. One terminal of the MTJ element 10 is connected to the bit line BL. The other terminal of the MTJ element 10 is connected to the drain terminal of the selection transistor 51. The gate terminal of the selection transistor 51 is connected to the word line WL. The source terminal of the selection transistor 51 is connected to the bit line /BL.

A row decoder 52 is connected to the word lines WL. A write circuit 54 and read circuit 55 are connected to the bit line pairs BL and /BL. A column decoder 53 is connected to the write circuit 54 and read circuit 55. The row decoder 52 and column decoder 53 select each memory cell MC.

Data is written in the memory cell MC as follows. First, to select the memory cell MC as an object of data write, the word line WL connected to the memory cell MC is activated. This turns on the selection transistor 51.

A bidirectional write current Iw is supplied to the MTJ element 10 in accordance with the write data. More specifically, when supplying the write current Iw to the MTJ element 10 from the left to the right, the write circuit 54 applies a positive voltage to the bit line BL, and the ground voltage to the bit line /BL. When supplying the write current Iw to the MTJ element 10 from the right to the left, the write circuit 54 applies a positive voltage to the bit line /BL, and the ground voltage to the bit line BL. In this manner, data "0" or "1" can be written in the memory cell MC.

Data is read from the memory cell MC as follows. First, the selection transistor 51 of the selected memory cell MC is turned on. The read circuit 55 supplies a read current Ir flowing from the right to the left, for example, to the MTJ element 10. On the basis of the read current Ir, the read circuit 55 detects the resistance value of the MTJ element 10. In this way, the data stored in the MTJ element 10 can be read.

Figure 20:
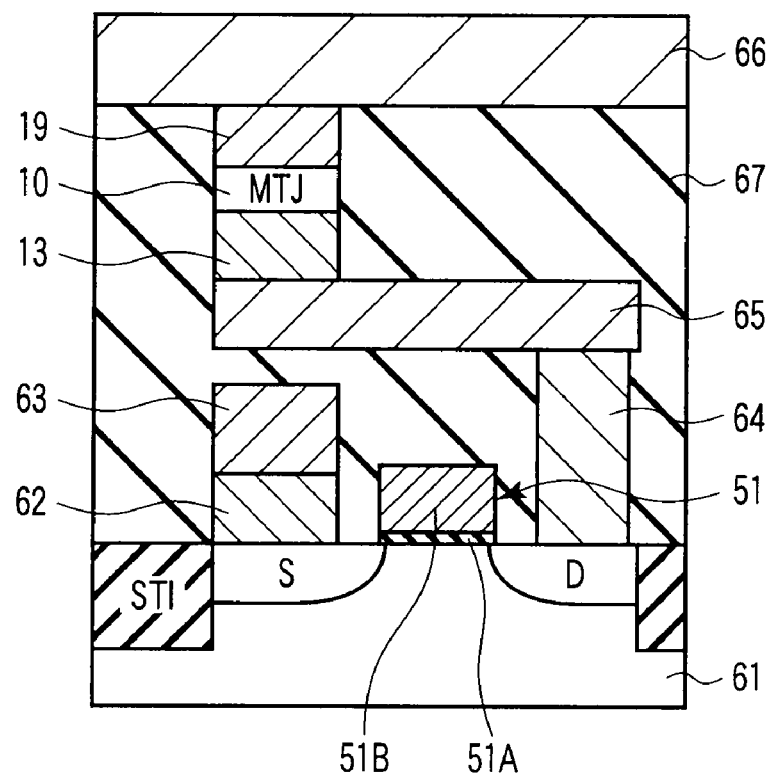
FIG. 20 is a sectional view illustrating the arrangement of the MRAM, particularly, a memory cell MC.

The structure of the MRAM will be explained below. FIG. 20 is a sectional view illustrating the arrangement of the MRAM, particularly, the memory cell MC.

An element isolation insulating layer is formed in the surface region of a P-type semiconductor substrate 61. A portion of the surface region of the semiconductor substrate 61 in which no element isolation insulating layer is formed is an element region (active area) where an element is to be formed. The element isolation insulating layer is formed by, e.g., STI (Shallow Trench Isolation). Silicon oxide or the like is used as STI.

In the element region of the semiconductor substrate 61, a source region S and drain region D are formed apart from each other. Each of the source region S and drain region D is an $N^+$-type diffusion region formed by heavily doping an $N^+$-type impurity into the semiconductor substrate 61. A gate electrode 51B is formed on a gate insulating film 51A on the semiconductor substrate 61 between the source region S and drain region D. The gate electrode 51B functions as the word line WL. The selection transistor 51 is thus formed on the semiconductor substrate 61.

An interconnection layer 63 is formed on a contact 62 on the source region S. The interconnection layer 63 functions as the bit line /BL.

An extraction line 65 is formed on a contact 64 on the drain region D. The MTJ element 10 sandwiched between a lower electrode 12 and upper electrode 19 is formed on the extraction line 65. An interconnection layer 66 is formed on the upper electrode 19. The interconnection layer 66 functions as the bit line BL. A portion between the semiconductor substrate 61 and interconnection layer 66 is filled with an interlayer dielectric layer 67 such as silicon oxide.

As described in detail above, the MRAM can be formed by using the MTJ element 10 according to the first embodiment. Note that the MTJ element 10 can be used not only in a spin transfer torque writing type magnetic memory, but also in a domain wall displacement type magnetic memory.

Note also that the MRAM according to the second embodiment is applicable to various apparatuses. Some application examples of the MRAM will be explained below.

Application Example 1

FIG. 21 specifically shows a digital subscriber line (DSL) data path portion of a DSL modem. This modem comprises a programmable digital signal processor (DSP) 100, analog-to-digital (A/D) converter 110, digital-to-analog (D/A) converter 120, transmission driver 130, reception amplifier 140, and the like.

No bandpass filter is shown in FIG. 21. Instead, FIG. 21 shows an MRAM 170 of this embodiment and an EEPROM 180 as various types of optional memories for storing a line code program (a program to be executed by the DSP to select and operate a modem in accordance with, e.g., coded subscriber line information and transmission conditions (line codes: QAM, CAP, RSK, FM, AM, PAM, DWMT, and the like)).

Note that this application example uses two types of memories, i.e., the MRAM 170 and EEPROM 180 as memories for storing the line code program. However, the EEPROM 180 may also be replaced with an MRAM. That is, it is also possible to use only MRAMs instead of using two types of memories.

Application Example 2

Figure 22:
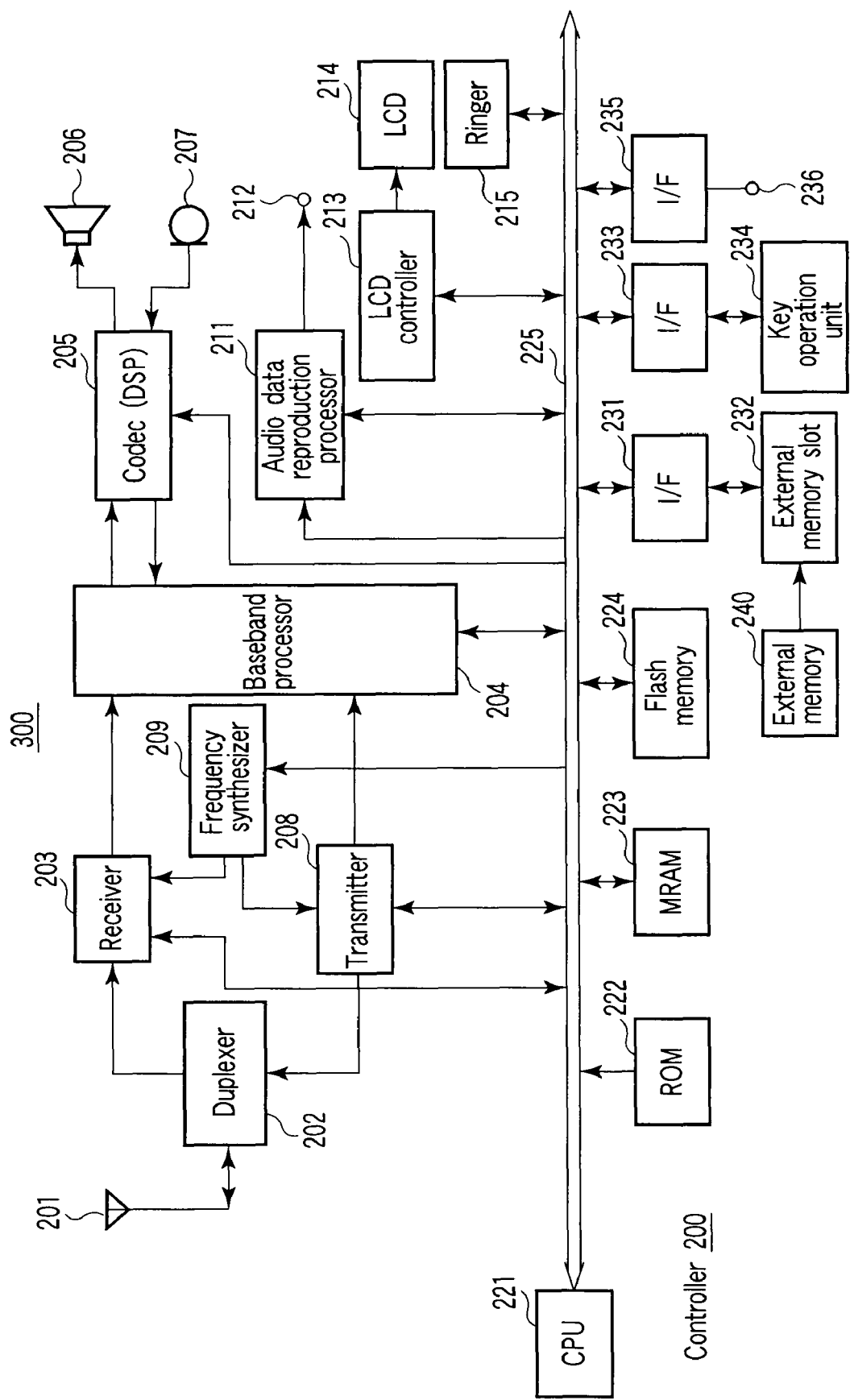
FIG. 22 is a block diagram illustrating a portable phone terminal 300 according to Application Example 2 of the MRAM.

FIG. 22 shows a portable phone terminal 300 as another application example. A communication unit 200 for implementing a communication function comprises, e.g., a transmitting/receiving antenna 201, an antenna duplexer 202, a receiver 203, a baseband processor 204, a DSP 205 to be used as a voice codec, a loudspeaker (telephone receiver) 206, a microphone (telephone transmitter) 207, a transmitter 208, and a frequency synthesizer 209.

The portable phone terminal 300 also has a controller 220 for controlling each unit of the portable phone terminal. The controller 220 is a microcomputer obtained by connecting a CPU 221, a ROM 222, an MRAM 223 of this embodiment, and a flash memory 224 via a bus 225. Programs to be executed by the CPU 221 and necessary data such as display fonts are prestored in the ROM 222.

The MRAM 223 is mainly used as a work area. The CPU 221 uses the MRAM 223 when storing data currently being calculated while executing a program as needed, and temporarily storing data to be exchanged between the controller 220 and each unit. When using a method that stores the setting conditions and the like immediately before the power supply of the portable phone terminal 300 is turned off, and sets the same conditions when the power supply is turned on next time, the flash memory 224 stores the set parameters. Accordingly, the stored set parameters do not disappear even when the power supply of the portable phone terminal 300 is turned off.

In addition, the portable phone terminal 300 has an audio reproduction processor 211, an external output terminal 212, an LCD controller 213, a display LCD (Liquid Crystal Display) 214, a ringer 215 for generating a ring back tone, and the like. The audio reproduction processor 211 reproduces audio information input to the portal phone terminal 300 (or audio information stored in an external memory 240 (to be described later)). The reproduced audio information can be extracted outside by, e.g., transmitting the information to headphones, a portable speaker, or the like via the external output terminal 212. Thus, the audio reproduction processor 211 makes it possible to reproduce audio information. The LCD controller 213 receives display information from, e.g., the CPU 221 via the bus 225, converts the information into LCD control information for controlling the LCD 214, and drives the LCD 214 to display an image.

The portable phone terminal 300 further comprises interface circuits (I/Fs) 231, 233, and 235, the external memory 240, an external memory slot 232, a key operation unit 234, an external input/output terminal 236, and the like. The external memory 240 such as a memory card is inserted into the external memory slot 232. The external memory slot 232 is connected to the bus 225 via the interface circuit (I/F) 231. Since the portable phone terminal 300 has the slot 232 as described above, it is possible to write internal information of the portable phone terminal 300 into the external memory 240, or input information (e.g., audio information) stored in the external memory 240 to the portable phone terminal 300.

The key operation unit 234 is connected to the bus 225 via the interface circuit (I/F) 233. Key input information from the key operation unit 234 is transmitted to, e.g., the CPU 221. The external input/output terminal 236 is connected to the bus 225 via the interface circuit (I/F) 233, and functions as a terminal that externally inputs various information to the portable phone terminal 300, or outputs information outside the portable phone terminal 300.

Note that this application example uses the ROM 222, MRAM 223, and flash memory 224. However, it is also possible to replace the flash memory 224 with an MRAM, and replace the ROM 222 with an MRAM as well.

Application Example 3

FIGS. 23 to 27 each illustrate an example in which the MRAM is applied to a card (MRAM card) such as SmartMedia for storing media contents.

Figure 23:
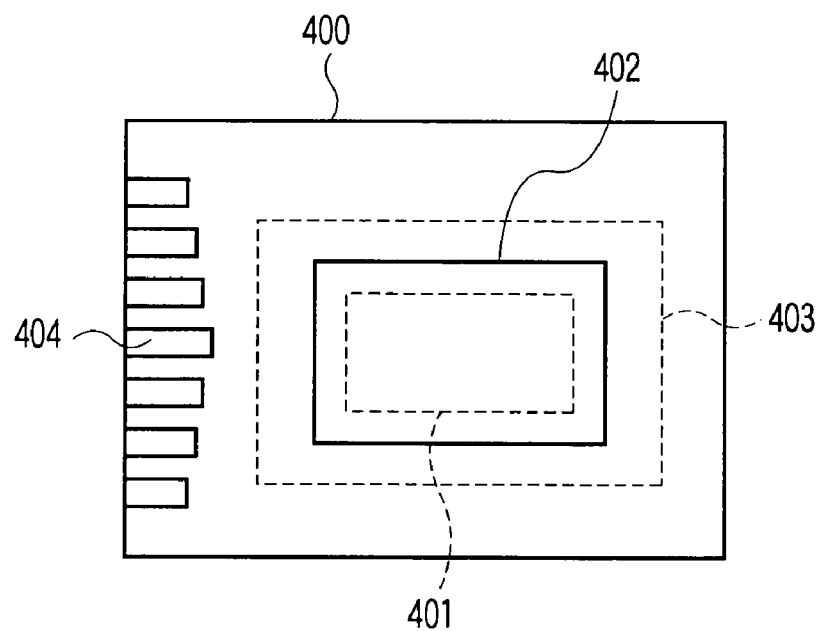
FIG. 23 is a plan view illustrating an MRAM card 400 according to Application Example 3 of the MRAM.

As shown in FIG. 23, an MRAM card main body 400 contains an MRAM chip 401. The card main body 400 has an opening 402 formed in a position corresponding to the MRAM chip 401, so the MRAM chip 401 is exposed. The opening 402 has a shutter 403 that protects the MRAM chip 401 when this MRAM card is carried by a user. The shutter 403 is made of a material, such as ceramic, having an effect of shielding an external magnetic field. Data is transferred by exposing the MRAM chip 401 by opening the shutter 403. External terminals 404 are used to extract the contents data stored in the MRAM card outside.

Figure 24:
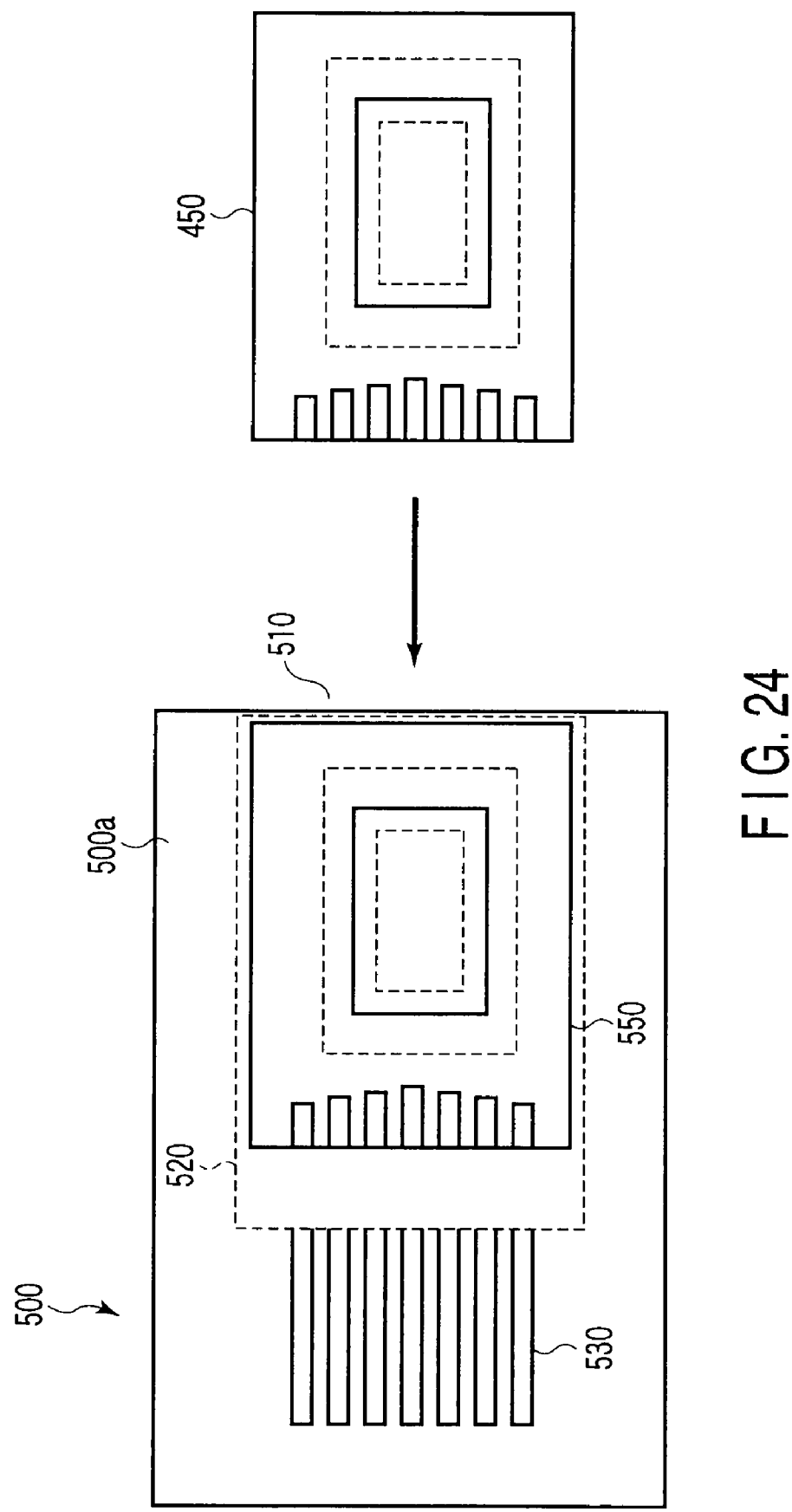
FIG. 24 is a plan view illustrating a transfer apparatus 500 for transferring data to the MRAM card.

FIGS. 24 and 25 are a plan view and sectional view, respectively, of a card insertion type transfer apparatus 500 for transferring data to the MRAM card described above.

The data transfer apparatus 500 has a housing portion 500a. A first MRAM card 550 is housed in the housing portion 500a. The housing portion 500a has external terminals 530 electrically connected to the first MRAM card 550. Data in the first MRAM card 550 is rewritten by using the external terminals 530.

A second MRAM card 450 used by an end user is inserted from an insertion portion 510 of the transfer apparatus 500 as indicated by the arrow. The second MRAM card 450 is pushed until it is stopped by a stopper 520. The stopper 520 also functions as a member for aligning the first MRAM card 550 and second MRAM card 450. When the second MRAM card 450 is set in a predetermined position, a first MRAM data rewrite controller supplies a control signal to the external terminals 530, thereby transferring data stored in the first MRAM card 550 to the second MRAM card 450.

FIG. 26 shows a fitting type transfer apparatus. In this transfer apparatus, a second MRAM card 450 is fitted on a first MRAM card 550 as indicated by the arrow by using a stopper 520 as a guide. A transfer method is the same as that of the card insertion type apparatus, so the explanation will not be repeated.

Figure 27:
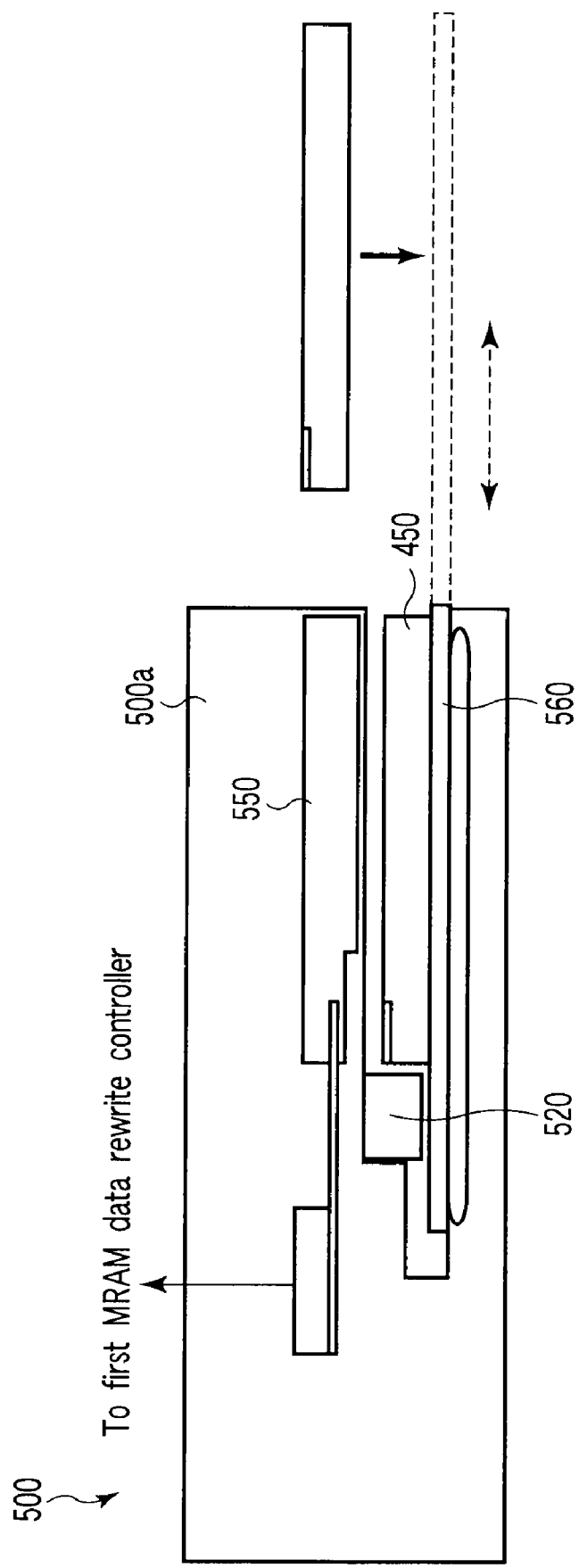
FIG. 27 is a sectional view illustrating a sliding type transfer apparatus 500 for transferring data to the MRAM card.

FIG. 27 shows a sliding type transfer apparatus. Similar to a CD-ROM drive or DVD drive, a transfer apparatus 500 has a receiving slide 560 that moves as indicated by the arrows. A second MRAM card 450 is placed on the receiving slide 560 having moved to the position indicated by the broken lines, and slid inside the transfer apparatus 500. The second MRAM card 450 is slid such that its leading end portion abuts against a stopper 520 in the same manner as in the card insertion type apparatus, and a transfer method is also the same as that of the card insertion type apparatus. Therefore, the explanation will not be repeated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetoresistive element comprising:
a first reference layer having magnetic anisotropy perpendicular to a film surface, and an invariable magnetization;
a recording layer having a stacked structure formed by alternately stacking magnetic layers and nonmagnetic layers, magnetic anisotropy perpendicular to a film surface, and a variable magnetization; and
a first intermediate layer provided between the first reference layer and the recording layer, and containing a nonmagnetic material,
wherein the magnetic layers include a first magnetic layer being in contact with the first intermediate layer and a second magnetic layer being not in contact with the first intermediate layer, and
the first magnetic layer contains an alloy containing cobalt (Co) and iron (Fe), and has a film thickness larger than that of the second magnetic layer.

2. The element according to claim 1, wherein at least one of the first magnetic layer and the second magnetic layer contains an alloy $Co_{100-x}Fe_x$ containing cobalt (Co) and iron (Fe), for which $x \geq 20$ at %.

3. The element according to claim 1, wherein the first magnetic layer contains an alloy $(Co_{100-x}-Fe_x)_{100-y}B_y$ containing cobalt (Co), iron (Fe), and boron (B), for which $x \geq 20$ at %, and $0 < y \leq 30$ at %.

4. The element according to claim 1, wherein at least one of the nonmagnetic layers included in the recording layer contains an alloy containing palladium (Pd) and gold (Au).

5. The element according to claim 1, one of the nonmagnetic layers which is farthest from the first intermediate layer contains gold (Au).

6. The element according to claim 1, wherein the first intermediate layer has an NaCl structure and orients in a (100) plane.

7. The element according to claim 1, wherein the first intermediate layer contains magnesium oxide.

8. The element according to claim 1, wherein the first magnetic layer has one of a cubic structure and a tetragonal structure and orients in a (100) plane.

9. The element according to claim 1, wherein the first reference layer contains a ferromagnetic alloy having an $L1_0$ structure.

10. The element according to claim 1, wherein the first reference layer contains at least one element selected from a group consisting of iron (Fe), cobalt (Co), and nickel (Ni), and at least one element selected from a group consisting of palladium (Pd) and platinum (Pt).

11. The element according to claim 1, further comprising an interface layer provided between the first reference layer and the first intermediate layer,
the interface layer containing an alloy $(Co_{100-x}-Fe_x)_{100-y}B_y$ containing cobalt (Co), iron (Fe), and boron (B), for which $x \geq 20$ at %, and $0 < y \leq 30$ at %.

12. The element according to claim 11, wherein the interface layer has one of a cubic structure and a tetragonal structure and orients in a (100) plane.

13. The element according to claim 1, further comprising:
a second reference layer having magnetic anisotropy perpendicular to a film surface, and invariable magnetization; and
a second intermediate layer provided between the second reference layer and the recording layer, and containing a nonmagnetic material.

14. The element according to claim 13, wherein the second intermediate layer contains gold (Au).

15. The element according to claim 13, wherein
at least one of the first reference layer and the second reference layer includes a third magnetic layer, a fourth magnetic layer, and a first nonmagnetic layer provided between the third magnetic layer and the fourth magnetic layer, and
the third magnetic layer and the fourth magnetic layer are antiferromagnetically coupled.

16. The element according to claim 15, wherein the first nonmagnetic layer contains one element selected from a group consisting of ruthenium (Ru), osmium (Os), rhenium (Re), and rhodium (Rh), or an alloy containing at least one element selected from a group consisting of ruthenium (Ru), osmium (Os), rhenium (Re), and rhodium (Rh).

17. A magnetoresistive element comprising:
a reference layer having magnetic anisotropy perpendicular to a film surface, and an invariable magnetization;
a recording layer having a stacked structure formed by alternately stacking magnetic layers and nonmagnetic layers, magnetic anisotropy perpendicular to a film surface, and a variable magnetization; and
an intermediate layer provided between the reference layer and the recording layer, and containing a nonmagnetic material,
wherein the magnetic layers include a first magnetic layer being in contact with the intermediate layer and a second magnetic layer being not in contact with the intermediate layer,
the first magnetic layer contains an alloy which has a composition $Co_2XY$, and has a film thickness larger than that of the second magnetic layer,
X is at least one element selected from the group consisting of vanadium (V), chromium (Cr), manganese (Mn), iron (Fe), nickel (Ni), and copper (Cu), and
Y is at least one element selected from the group consisting of aluminum (Al), gallium (Ga), indium (In), silicon (Si), germanium (Ge), tin (Sn), and antimony (Sb).

18. The element according to claim 17, wherein at least one of the first magnetic layer and the second magnetic layer contains an alloy $Co_{100-x}Fe_x$ containing cobalt (Co) and iron (Fe), for which $x \geqq 20$ at %.

19. The element according to claim 17, wherein at least one of the nonmagnetic layers included in the recording layer contains an alloy containing palladium (Pd) and gold (Au).

20. The element according to claim 17, wherein one of the nonmagnetic layers which is farthest from the intermediate layer contains gold (Au).

21. The element according to claim 17, wherein the first magnetic layer has one of a cubic structure and a tetragonal structure and orients in a (100) plane.

22. A magnetic memory comprising a memory cell including a magnetoresistive element, and a first electrode and a second electrode sandwiching the magnetoresistive element to supply a current to the magnetoresistive element, the magnetoresistive element comprising:
a first reference layer having magnetic anisotropy perpendicular to a film surface, and an invariable magnetization;
a recording layer having a stacked structure formed by alternately stacking magnetic layers and nonmagnetic layers, magnetic anisotropy perpendicular to a film surface, and a variable magnetization; and
a first intermediate layer provided between the first reference layer and the recording layer, and containing a nonmagnetic material,
wherein the magnetic layers include a first magnetic layer being in contact with the first intermediate layer and a second magnetic layer being not in contact with the first intermediate layer, and
the first magnetic layer contains an alloy containing cobalt (Co) and iron (Fe), and has a film thickness larger than that of the second magnetic layer.

23. The memory according to claim 22, further comprising:
a first interconnection electrically connected to the first electrode;
a second interconnection electrically connected to the second electrode; and
a write circuit electrically connected to the first interconnection and the second interconnection, and configured to supply the current to the magnetoresistive element in two directions.

24. The memory according to claim 23, wherein the memory cell includes a selection transistor electrically connected between the second electrode and the second interconnection.

* * * * *